(12) United States Patent
Chen et al.

(10) Patent No.: US 9,385,267 B2
(45) Date of Patent: Jul. 5, 2016

(54) LIGHT-EMITTING DIODE

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/874,467

(22) Filed: Oct. 4, 2015

(65) Prior Publication Data

US 2016/0064594 A1 Mar. 3, 2016

Related U.S. Application Data

(63) Continuation-in-part of application No. 14/470,947, filed on Aug. 28, 2014, now Pat. No. 9,184,342.

(51) Int. Cl.
| | |
|---|---|
| *H01L 33/00* | (2010.01) |
| *H01L 33/60* | (2010.01) |
| *H01L 33/44* | (2010.01) |
| *H01L 33/14* | (2010.01) |
| *H01L 33/02* | (2010.01) |
| *H01L 33/38* | (2010.01) |
| *H01L 21/02* | (2006.01) |
| *H01L 33/46* | (2010.01) |

(52) U.S. Cl.
CPC .......... *H01L 33/0079* (2013.01); *H01L 33/145* (2013.01); *H01L 33/44* (2013.01); *H01L 21/0254* (2013.01); *H01L 21/02458* (2013.01); *H01L 21/02642* (2013.01); *H01L 21/02647* (2013.01); *H01L 33/025* (2013.01); *H01L 33/38* (2013.01); *H01L 33/46* (2013.01)

(58) Field of Classification Search
CPC ... H01L 33/002; H01L 33/005; H01L 33/007; H01L 33/025; H01L 33/32; H01L 33/60; H01L 33/44; H01L 33/10; H01L 33/145; H01L 33/00; H01L 33/38; H01L 21/02458; H01L 21/0254; H01L 21/02642; H01L 21/02647; H01L 33/18
See application file for complete search history.

(56) References Cited

U.S. PATENT DOCUMENTS

| | | | | |
|---|---|---|---|---|
| 2004/0067648 | A1* | 4/2004 | Morita | C30B 25/02 438/689 |
| 2005/0279994 | A1* | 12/2005 | Ueda | B82Y 20/00 257/33 |
| 2012/0168753 | A1* | 7/2012 | Sanga | H01L 33/02 257/52 |

*Primary Examiner* — Jasmine Clark
(74) *Attorney, Agent, or Firm* — CKC & Partners Co., Ltd.

(57) ABSTRACT

A light-emitting diode (LED) includes a first type semiconductor layer, a second type semiconductor layer, a first current controlling structure, and a first electrode. The second type semiconductor layer is joined with the first type semiconductor layer. The second type semiconductor layer has a first region and a second region, in which the first region has a first threading dislocation density, the second region has a second threading dislocation density, and the first threading dislocation density is greater than the second threading dislocation density. The first current controlling structure is joined with the first type semiconductor layer and has at least one first current-injecting zone therein, in which the vertical projection of the second region on the first current controlling structure at least partially overlaps with the first current-injecting zone. The first electrode is electrically coupled with the first type semiconductor layer.

20 Claims, 27 Drawing Sheets

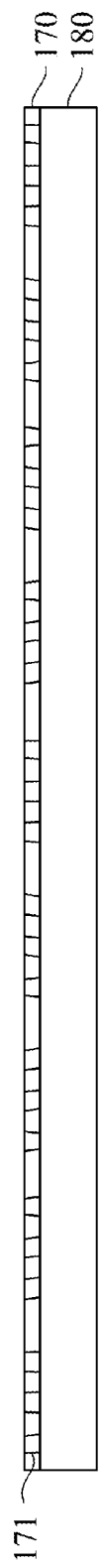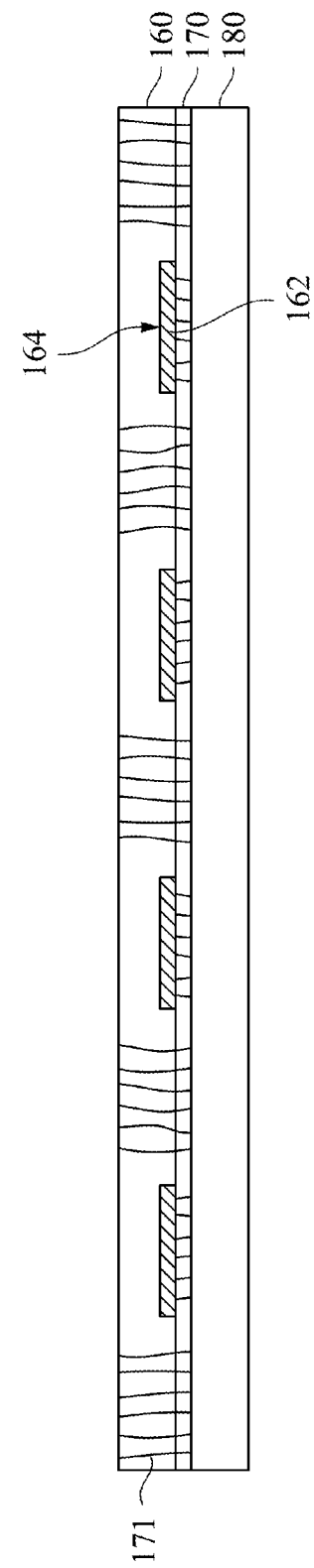

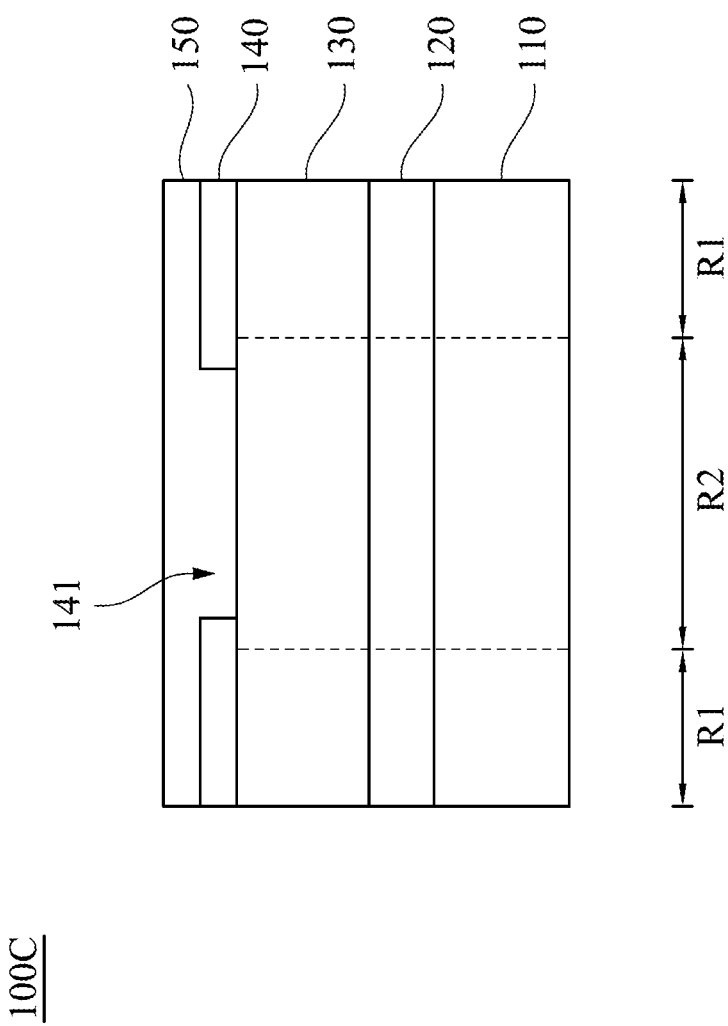

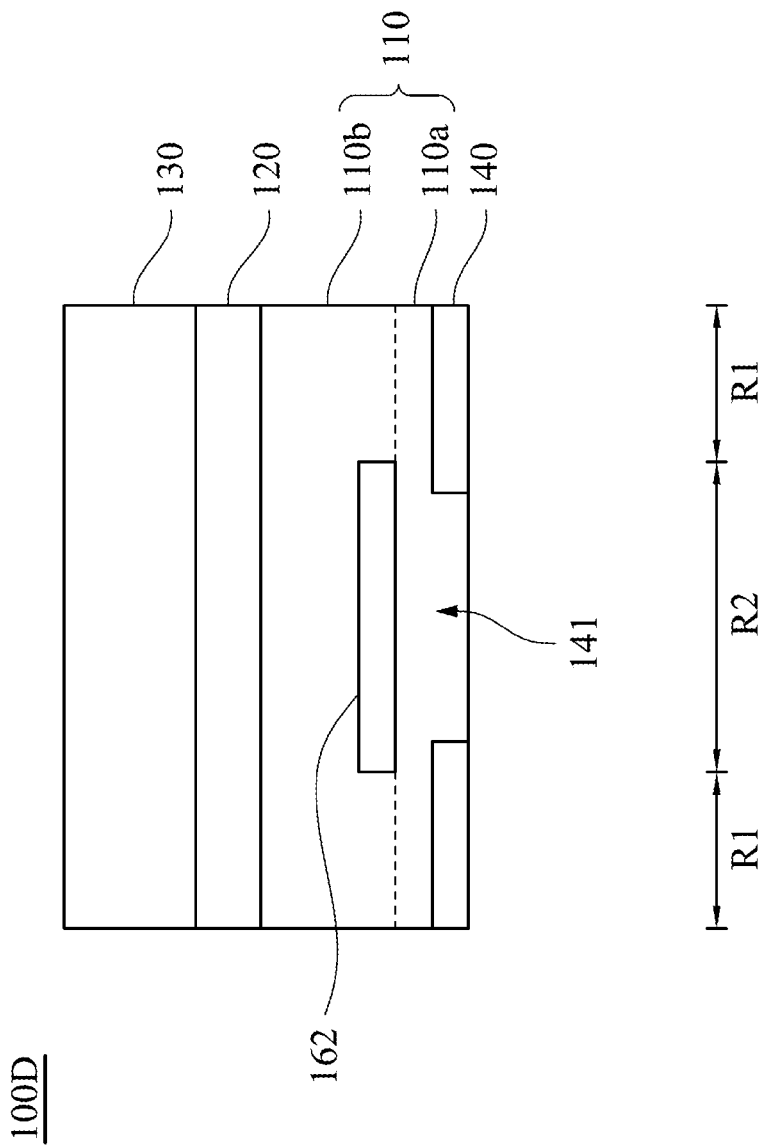

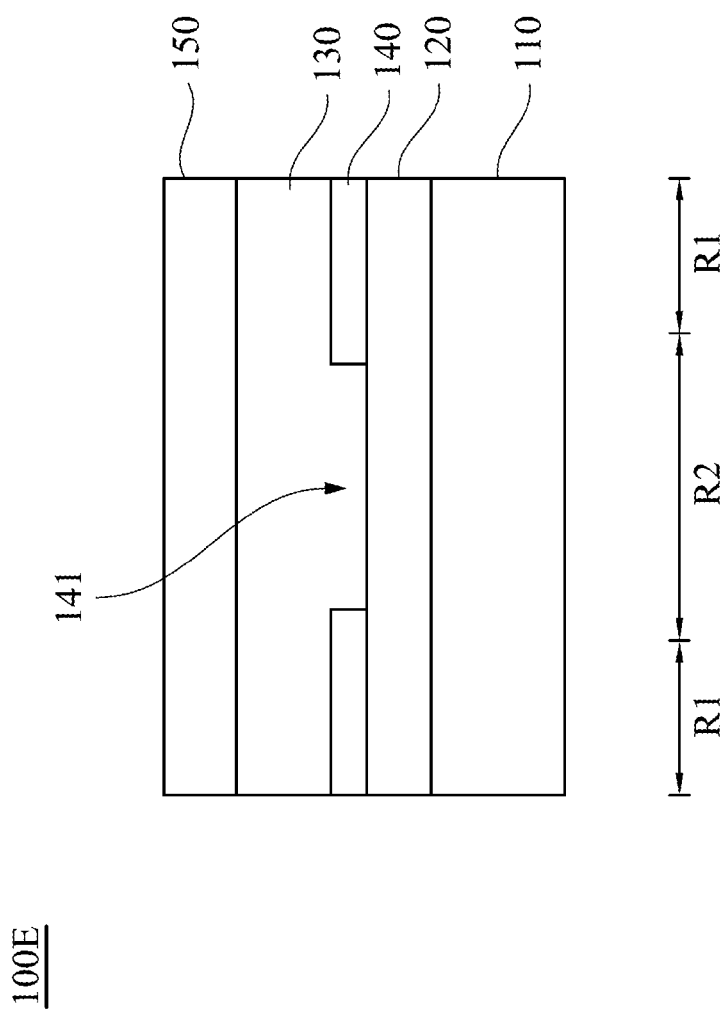

LIGHT-EMITTING DIODE

RELATED APPLICATIONS

The present application is a continuation-in-part application of U.S. application Ser. No. 14/470,947, filed on Aug. 28, 2014, now U.S. Pat. No. 9,184,342. The entire disclosure of the above application is hereby incorporated by reference herein.

BACKGROUND

1. Technical Field

The present disclosure relates to light-emitting diodes (LEDs).

2. Description of Related Art

Light emitting diodes (LEDs) are semiconductor light-emitting devices which convert electricity into light energy. As being light sources, LEDs have advantages including low energy consumption, long lifetime, small size, and fast switching, and hence conventional illuminant technology, such as incandescent lamps, is gradually replaced by LEDs.

GaN(InGaN, AlGaN) based LEDs have became the majority of LED Illumination. However, the efficiency of GaN based LEDs may suffer from the threading dislocating defects in the epitaxy. Typically, threading defects arise in efforts to epitaxially grow one kind of crystalline material on a substrate of a different kind of material. Because of different crystalline lattice constants and different coefficients of thermal expansion of the two materials, lattice mismatch between the two materials creates stress and generates threading dislocating defects while fabricating LED devices. Such threading dislocating defects in the emitting areas of LED devices may reduce efficiency and its stability.

SUMMARY

According to some embodiments of the present disclosure, a light-emitting diode (LED) includes a first type semiconductor layer, a second type semiconductor layer, and at least one current controlling structure. The first type semiconductor layer has a first region and a second region. The first region has a first threading dislocation density. The second region has a second threading dislocation density. The first threading dislocation density is greater than the second threading dislocation density. The second type semiconductor layer is joined with the first type semiconductor layer. At least one current controlling structure is joined with at least one of the first type semiconductor layer and the second type semiconductor layer. The current controlling structure has at least one current-injecting zone that allows carriers to pass through. A vertical projection of the second region on the current controlling structure at least partially overlaps with the current-injecting zone.

According to some embodiments of the present disclosure, a method for manufacturing a light-emitting diode (LED) includes forming at least one dislocation-controlling feature on a substrate. A first type semiconductor layer is formed on the dislocation-controlling feature and the substrate, in which the first type semiconductor layer has a first region and a second region, and the dislocation-controlling feature causes a threading dislocation density of the first region to be greater than that of the second region. A second type semiconductor layer is formed on the first type semiconductor layer. A current controlling structure is formed to be joined with at least one of the first type semiconductor layer and the second type semiconductor layer, in which the current controlling structure has at least one current-injecting zone therein, and a vertical projection of the dislocation-controlling feature on the current controlling structure at least partially overlaps with the current-injecting zone.

BRIEF DESCRIPTION OF THE DRAWINGS

FIGS. 2A-2J are cross-sectional views of a method for manufacturing the LED illustrated in FIG. 1A;

FIG. 6 is a cross-sectional view of an LED according to a third embodiment of the present disclosure;

FIG. 8 is a cross-sectional view of an LED according to a fourth embodiment of the present disclosure;

FIG. 10 is a cross-sectional view of an LED according to a fifth embodiment of the present disclosure;

DETAILED DESCRIPTION

Figure 1A:
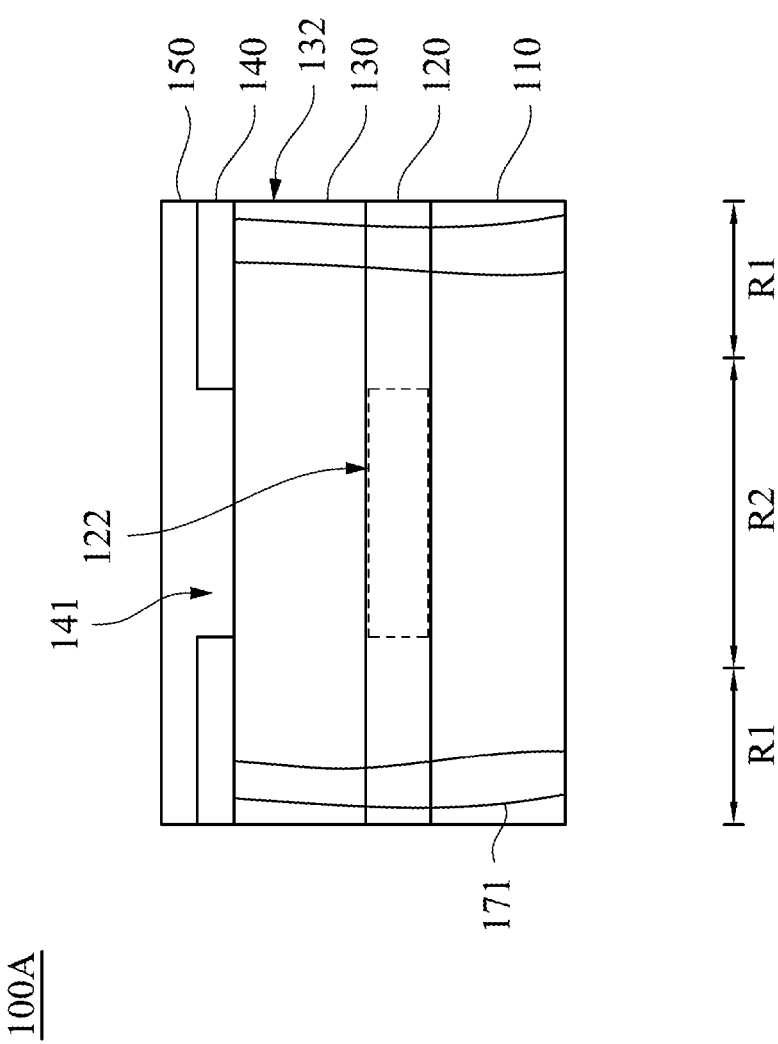
FIG. 1A is a cross-sectional view of a light-emitting diode (LED) according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Some embodiments of the present disclosure relate to light-emitting diodes (LEDs). In one or more embodiments of the present disclosure, by forming a dislocation-controlling feature, when growing layers on a substrate, threading dislocations arising from the lattice mismatch can be blocked from propagating into upper layers. Moreover, the LED includes a current controlling structure that includes at least one current-injecting zone therein. The current-injecting zone can confine the area where the current goes into the LED, such that the current density within the emitting area of the LED can be increased. In some embodiments of the present disclosure, the current-injecting zones can be aligned with the emitting area having a low density of threading dislocation defects, so as to improve the luminous efficiency of the LED.

FIG. 1A is a cross-sectional view of an LED 100A according to a first embodiment of the present disclosure. An LED 100A includes a first type semiconductor layer 110, an active layer 120, a second type semiconductor layer 130, at least one current controlling structure 140, and an electrode layer 150. The first type semiconductor layer 110 has a first region R1 and a second region R2. The first region R1 has a first threading dislocation density, and the second region R2 has a second threading dislocation density. The first threading dislocation density is greater than the second threading dislocation density. The second type semiconductor layer 130 is joined with the first type semiconductor layer 110, in which the active layer 120 is disposed between the first type semiconductor layer 110 and the second type semiconductor layer 130. The current controlling structure 140 is joined with the second type semiconductor layer 130. The current controlling structure 140 has at least one current-injecting zone 141 that allows carriers to pass through, in which the current-injecting zone 141 in the present embodiment is an opening, but is not limited thereto. A vertical projection of the second region R2 on the current controlling structure 140 at least partially overlaps with the current-injecting zone 141. The electrode layer 150 is electrically coupled with the second type semiconductor layer 130 through the current-injecting zone 141 of the current controlling structure 140.

Under this configuration, since the first threading dislocation density of the first region R1 of the first type semiconductor layer 110 is greater than the second threading dislocation density of the second region R2 of the first type semiconductor layer 110, the active layer 120 formed after formation of the first type semiconductor layer 110 has a similar distribution of the threading dislocation density. That is, in the active layer 120, the threading dislocation density corresponding to the first region R1 (or on the first region R1) is greater than the threading dislocation density corresponding to the second region R2 (or on the second region R2). That is, the active layer 120 corresponding to the second region R2 can be formed with the less threading dislocation density.

Moreover, as shown in FIG. 1A, the first current-injecting zone 141 defines a contact area between the electrode layer 150 and the second type semiconductor layer 130. When the LED 100A is forward biased, charge carriers flow from the contact area between the electrode layer 150 and the second type semiconductor layer 130 to the active layer 120. In the active layer 120, the electrons and holes recombine across the semiconductor gap, so the active layer 120 emits the light. More specifically, since the first current-injecting zone 141 limits the area where the current goes into the LED 100A, a light emitting area 122 in the active layer 120 can be formed under the first current-injecting zone 141.

Furthermore, since the vertical projection of the second region R2 on the current controlling structure 140 at least partially overlaps with the current-injecting zone 141, the light emitting area 122 in the active layer 120 also at least partially overlaps with the current-injecting zone 141. In other words, the light emitting area 122 is present within the region having the threading dislocation density corresponding to the first region R2. Explained in a different way, the light emitting area 122 in the active layer 120 has a lower dislocation density than other area in the active layer 120. Accordingly, the luminous efficiency of the LED 100A can be improved.

In some embodiments, the vertical projection of the second region R2 on the current controlling structure 140 is larger than the current-injecting zone 141, and the current-injecting zone 141 is present within the vertical projection of the second region R2 on the current controlling structure 140. Therefore, the charge carriers from the first current-injecting zone 141 can substantially avoid from flowing into the first region R1 that has greater threading dislocation density than the second region R2. Therefore, the luminous efficiency of the LED 100A may not be affected by the first region R1.

In some embodiments, the first region R1 has a greater threading dislocation density in a range from about $10^5$ to about $10^7/cm^2$ or more. The second region R2 has a lower threading dislocation density in a range from about $10^5/cm^2$ or less to about $10^7/cm^2$. In yet another embodiment, the ratio of the first threading dislocation density of the first region R1 to the second threading dislocation of the second region R2 is in a range at least greater than 2:1.

In some embodiments, the active layer 120 can be omitted. In the embodiments that the active layer 120 is omitted, the second type semiconductor layer 130 is directly disposed on the first type semiconductor layer 110, and the light emitting area is formed under the first current-injecting zone 141 and at an interface between the first type semiconductor layer 110 and the second type semiconductor layer 130. For example, if the first type semiconductor layer 110 is a p type semiconductor layer, the second type semiconductor layer 130 is an n type semiconductor layer, and the light emitting area is substantially a p-n junction between the first type semiconductor layer 110 and the second type semiconductor layer 130.

FIGS. 1B-1E are plan views of the current controlling structure in FIG. 1A according to various embodiments of the present disclosure. As shown in FIGS. 1A-1E, the number and the shape of the first current-injecting zone 141 of the current controlling structure 140 illustrated in FIG. 1A can be varied.

Figure 1B:
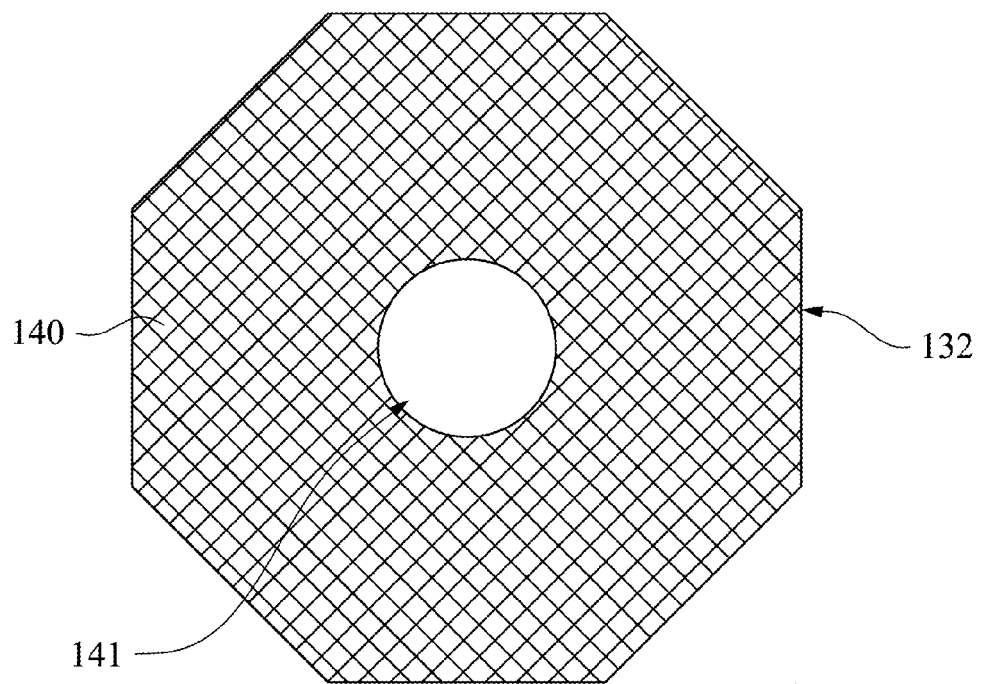
FIGS. 1B-1E are plan views of the current controlling structure in FIG. 1A according to various embodiments of the present disclosure.

As shown in FIG. 1B, the number of the first current-injecting zone 141 of the current controlling structure 140 is one. Furthermore, the current-injecting zone 141 is separated from an edge 132 of the second type semiconductor layer 130 (see FIG. 1A) by at least a part of the current controlling structure 140. Explained in a different way, the current-injecting zone 141 illustrated in FIG. 1B can be taken as an opening with an enclosed type.

Figure 1C:
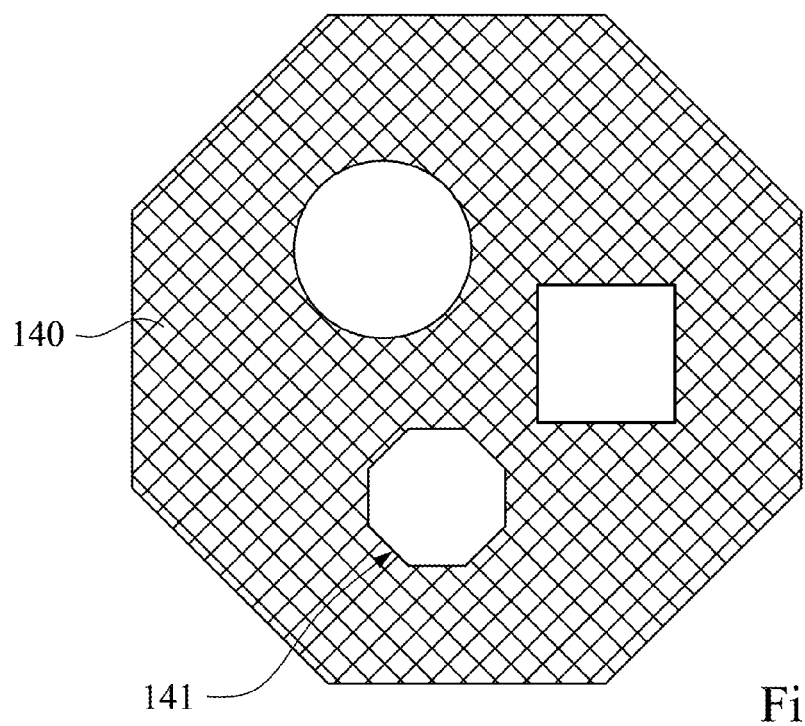

As shown in FIG. 1C, the number of the first current-injecting zones 141 of the current controlling structure 140 is three. In other words, in some embodiments, the number of the first current-injecting zones 141 of the current controlling structure 140 can be plural. Similarly, the current-injecting zones 141 illustrated in FIG. 1C can be taken as the enclosed type openings. Moreover, in the embodiments that the number of the first current-injecting zones 141 of the current controlling structure 140 is plural, the vertical projection of the second region R2 (see FIG. 1A) on the current controlling structure 140 is larger than at least one of the plurality of the current-injecting zones 141, and at least one of the current-injecting zones 141 is present within the vertical projection of the second region R2 (see FIG. 1A) on the current controlling structure 140.

Figure 1D:
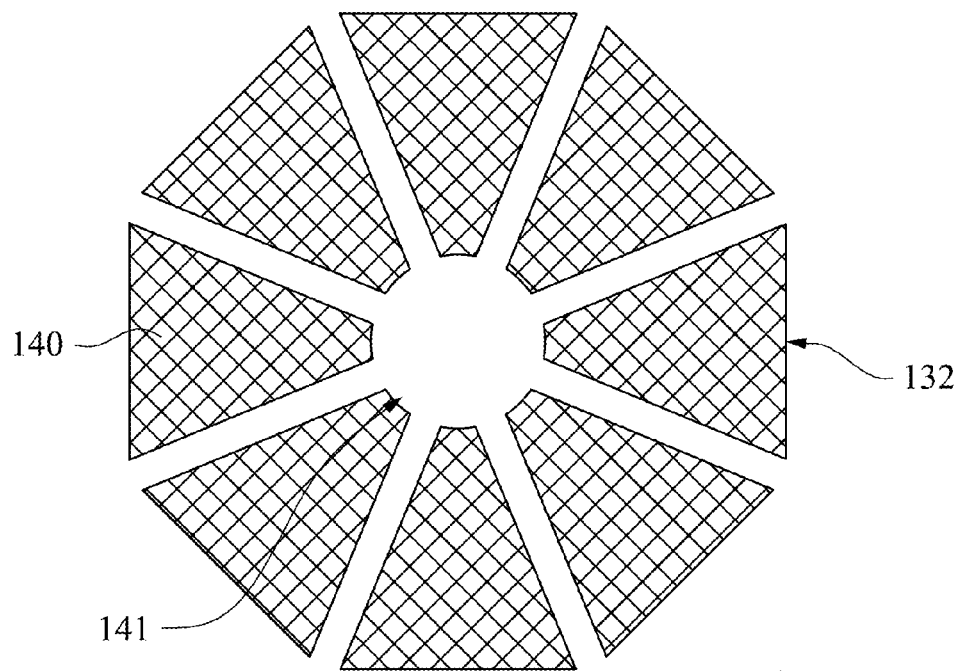

In FIG. 1D, the number of the first current-injecting zone 141 of the current controlling structure 140 is similar to one. Furthermore, the current-injecting zone 141 is adjacent to the edge 132 of the second type semiconductor layer 130.

Explained in a different way, the current-injecting zone 141 illustrated in FIG. 1D can be taken as the open type opening.

Figure 1E:
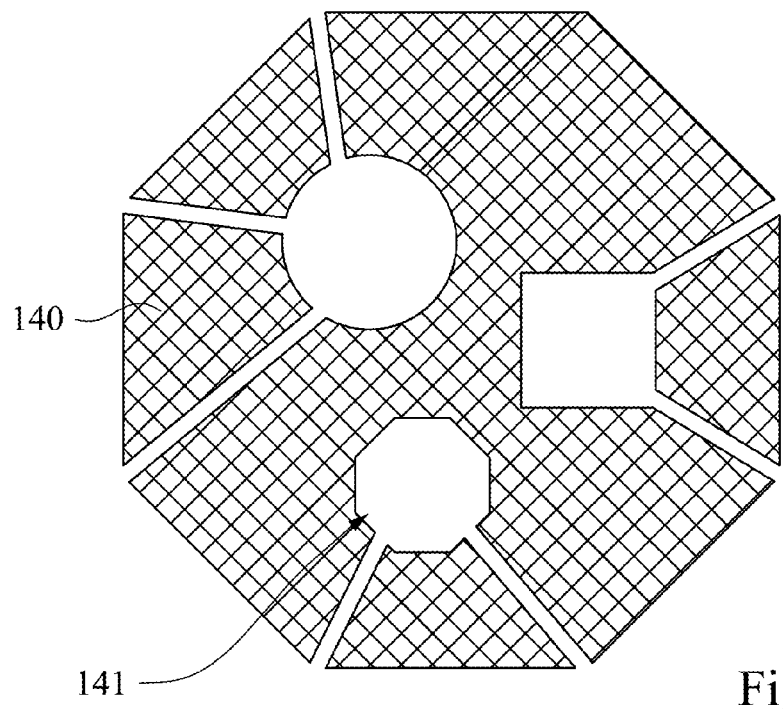

In FIG. 1E, the number of the first current-injecting zones 141 of the current controlling structure 140 is similar to three, and the current-injecting zones 141 illustrated in FIG. 1E can be taken as the open type openings. Similarly, in the embodiments illustrated in FIG. 1E, the vertical projection of the second region R2 (see FIG. 1A) on the current controlling structure 140 is larger than at least one of the plurality of the current-injecting zones 141, and one of the current-injecting zones 141 is present within the vertical projection of the second region R2 (see FIG. 1A) on the current controlling structure 140.

Next, a method for manufacturing the LED 100A is provided. The LED 100A shown in FIG. 1A can be manufactured according to operations sequentially illustrated by FIGS. 2A-2J, in which FIGS. 2A-2J are cross-sectional views of a method for manufacturing the LED 100A illustrated in FIG. 1A.

As shown in FIG. 2A, a buffer layer 170 is formed on a substrate 180, in which the substrate 180 is a growth substrate. More specifically, several growth techniques may be used for growth of the buffer layer 170, such as metal organic CVD (MOCVD), molecular beam epitaxy (MBE), hydride vapor phase epitaxy (HVPE), and liquid phase epitaxy (LPE).

In some embodiments, when the buffer layer 170 and the substrate 180 are made of different materials, it is apt to create lattice mismatch between the buffer layer 170 and the substrate 180 due to the different crystalline lattice constants and different coefficients of thermal expansion between the buffer layer 170 and the substrate 180. As shown in FIG. 2A, a plurality of threading dislocations 171 arise from the lattice mismatch between the substrate 180 and the buffer layer 170, in which the threading dislocations 171 are substantially distributed randomly in the buffer layer 170.

In some embodiments, the substrate 180 may be a bulk substrate including sapphire ($Al_2O_3$). Alternatively, the substrate 180 may be formed of other suitable materials such as, Si, GaN, SiC, or GaAs. In some embodiments, the buffer layer 170 may be made of a material different from or the same as the substrate 180. Alternatively, the buffer layer 170 may be a III-V compound semiconductor layer such as GaN, InN, AlN, InGaN, AlGaN, InAlGaN, and combinations thereof.

As shown in FIG. 2B, dislocation-controlling features 162 are formed on the buffer layer 170 and the substrate 180, in which the dislocation-controlling features 162 are configured to block the propagation of the threading dislocations 171. Furthermore, in the present embodiment, the formation of the buffer layer 170 on the substrate 180 is before the formation of the dislocation-controlling features 162, and the dislocation-controlling features 162 are formed on the buffer layer 170. Then, an epitaxial lateral overgrowth (ELOG) layer 160 is at least formed on the dislocation-controlling features 162.

In some embodiments, the ELOG layer 160 can be formed by epitaxy along a horizontal direction (parallel to the substrate 180), and voids 164 may be formed on the dislocation-controlling features 162 or between the ELOG layer 160 and the dislocation-controlling features 162. For example, at least one of the voids 164 may form on the center of the corresponding dislocation-controlling feature 162. In other embodiments, with adjusting the growth rate of the ELOG layer 160, the voids 164 can be controlled. For example, as the ELOG layer 160 is formed in slow growth rate, the voids 164 may not exist.

Figure 2C:
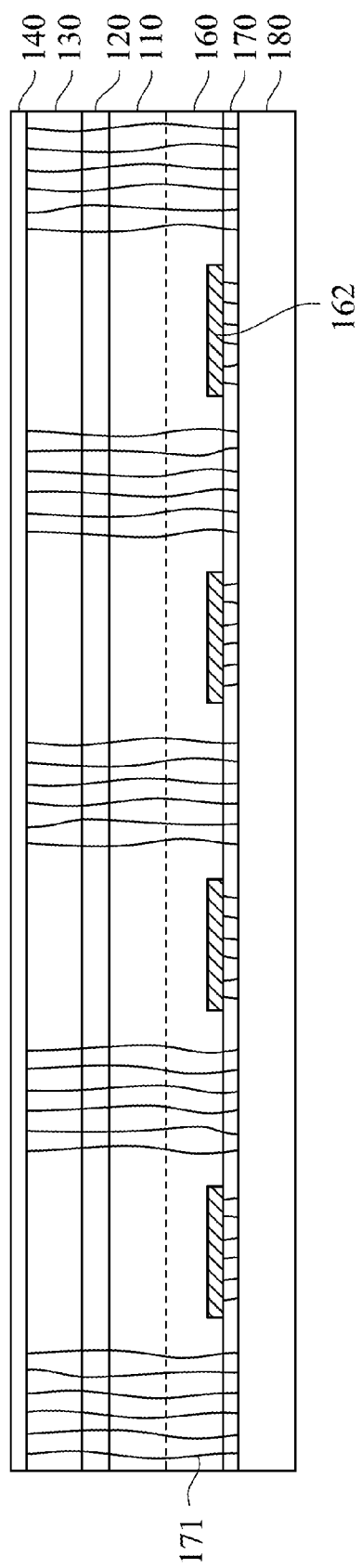

As shown in FIG. 2C, the first type semiconductor layer 110 is formed on the ELOG layer 160, the dislocation-controlling features 162, the buffer layer 170 and the substrate 180. An active layer 120 is formed on the first type semiconductor layer 110. A second type semiconductor layer 130 is formed on the active layer 120 and the first type semiconductor layer 110. A current controlling structure 140 joined with the second type semiconductor layer 130 is formed on the second type semiconductor layer 130.

In the present embodiment, the first type semiconductor layer 110 is formed on the ELOG layer 160, in which a dot line between the first type semiconductor layer 110 and the ELOG layer 160 is illustrated in FIG. 2C. In the formations of the first type semiconductor layer 110 and the ELOG layer 160, the first type semiconductor layer 110 and the ELOG layer 160 can be formed in one process or more than one process. Explained in a different way, the first type semiconductor layer 110 and the ELOG layer 160 illustrated as two layers at the opposite sides of the dot line in FIG. 2C may be the same layer or two individual layers.

Referring now to FIGS. 2B and 2C, in the present embodiment, each of the dislocation-controlling features 162 is a dislocation-blocking feature. In this configuration, the threading dislocations 171 under the dislocation-controlling features 162 tend to not propagate into the ELOG layer 160. The threading dislocations 171 in the buffer layer 170 may propagate into the ELOG layer 160 only through regions between adjacent dislocation-controlling features 162. Consequently, the threading dislocations 171 in the ELOG layer 160 shown in FIGS. 2B and 2C are distributed separately. That is, regions above the dislocation-controlling features 162 have a lower threading dislocation density than that of regions which are not above the dislocation-controlling features 162.

Since the dislocation-controlling features 162 are capable of blocking the threading dislocations 171 from propagating into the upper layers, the dislocation-controlling feature 162 causes the threading dislocation density of the first region R1 (see FIG. 1A) to be greater than that of the second region R2 (see FIG. 1A). That is, in the first type semiconductor layer 110, the vertical projections of the regions on the ELOG layer 160 overlapping with the dislocation-controlling features 162 have less threading dislocation density.

Furthermore, in some embodiments, the buffer layer 170 may be omitted. In the embodiments that the buffer layer 170 is omitted, the ELOG layer 160 is formed on the substrate 180, and the dislocation-controlling feature 162 are disposed between the ELOG layer 160 and the first type semiconductor layer 110.

Therefore, as described above, since the buffer layer 170, the ELOG layer 160, and the first type semiconductor layer 110 can be formed separately. In some embodiments, the buffer layer 170, the ELOG layer 160, and the first type semiconductor layer 110 are made by different materials or the same material. In other embodiments, the two layers of the buffer layer 170, the ELOG layer 160, and the first type semiconductor layer 110 are made by the same material, and another layer of the buffer layer 170, the ELOG layer 160, and the first type semiconductor layer 110 is made of the different material.

Furthermore, in some embodiments, the dislocation-controlling features 162 are made of a dielectric material. More specifically, the dislocation-controlling features 162 may be made of a material selected from dielectric materials, such as $SiN_x$ or $SiO_x$ (with x being a positive value, and may be in range $0<x\leq3$). Alternatively, the dislocation-controlling features 162 may be made of conductive material, such as W, Ni, Ag, Al, Ti, or Cr; metal alloys such as Ti—Au or Al—Ag; or metal nitrides such as TiN or TaN. In some embodiments, the dislocation-controlling features 162 may be made of multi-layers of the above-discussed materials. The applicable deposition methods for forming the dislocation-controlling features 162 include physical vapor deposition (PVD) and chemical vapor deposition (CVD). In addition, in the embodiments that the dislocation-controlling features 162 are made of metal, the applicable deposition methods for forming the dislocation-controlling features 162 includes sputtering. Then, the patterning may be performed using a dry etching and/or a wet etching to form a plurality of dislocation-controlling features 162 spaced from each other.

Figure 2D:
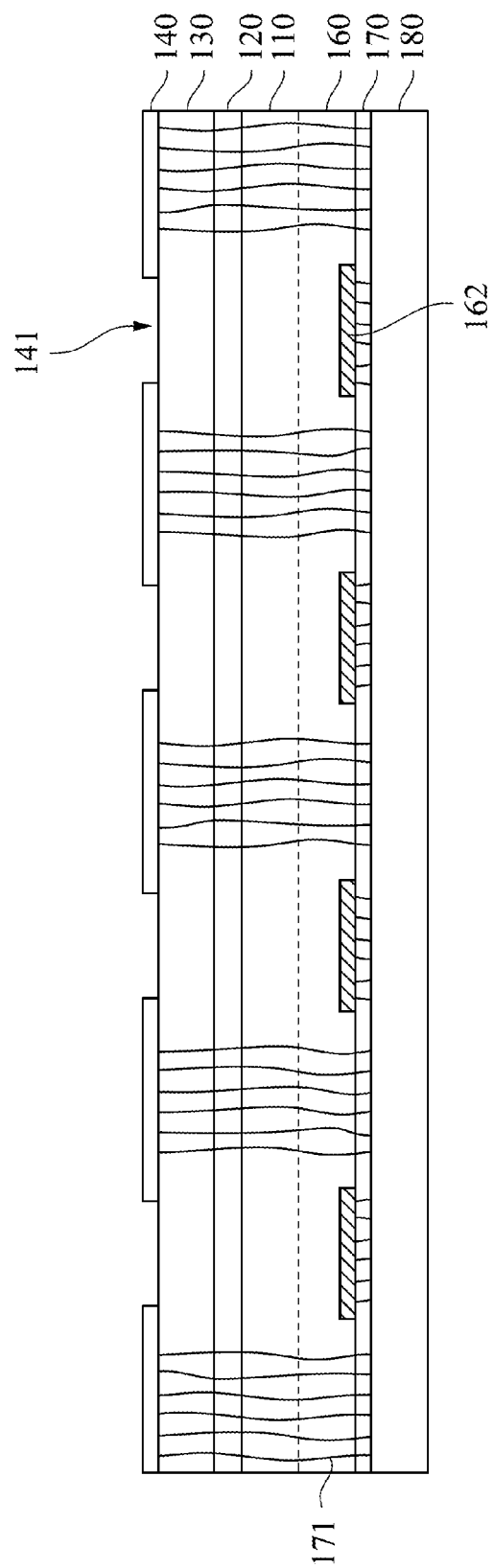
Figure 2E:
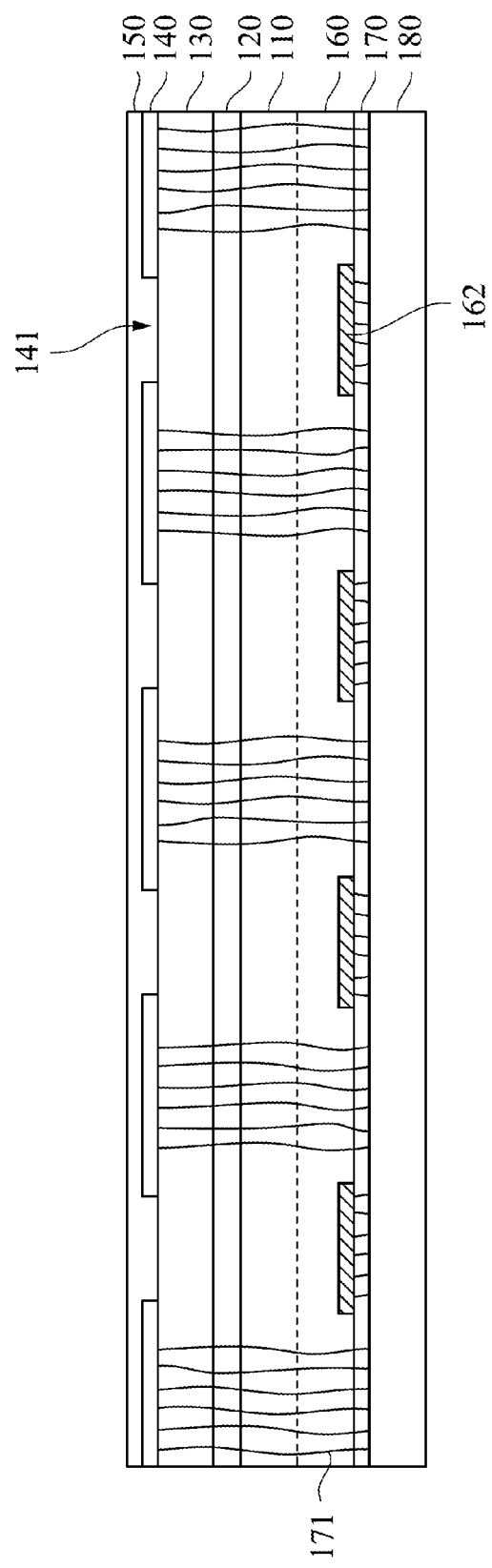

As shown in FIG. 2D, a plurality of first current-injecting zones 141 are formed within the first current controlling structure 140. In the present embodiment, the patterned current controlling structure 140 has the current-injecting zones 141 therein, and a vertical projection of the dislocation-controlling features 162 on the current controlling structure 140 at least partially overlaps with the current-injecting zones 141. Therefore, the current flowing the active layer 120 can go into the region with the lower threading dislocation density.

Furthermore, according to some embodiments of the present disclosure, after a plurality of the LEDs 100A are manufactured (as described in the following description), each of the LEDs 100A has at least one first current-injecting zone 141, but the present disclosure is not limited in this regard. In some embodiments, after a plurality of the LEDs 100A are manufactured, each of the LEDs 100A may have more than one first current-injecting zone 141.

However, in some embodiments, the current controlling structure 140 with the at least one current-injecting zone 141 can be formed in the at least one of the first type semiconductor layer 110 and the second type semiconductor layer 130. The embodiments that the current controlling structure 140 with the at least one current-injecting zone 141 are formed in the at least one of the first type semiconductor layer 110 and the second type semiconductor layer 130 are described later.

As shown in 2E, an electrode layer 150 may then be formed over the first current controlling structure 140. The electrode layer 150 is electrically coupled with the second type semiconductor layer 130 through the first current-injecting zones 141. The electrode layer 150 serves as a conductive layer, though other layers may be included. In some embodiments, the electrode layer 150 has a thickness of approximately 1 μm-15 μm. Alternatively, in some embodiments, the electrode layer 150 may be formed on another substrate (not illustrated) in advance, rather than formed on the patterned first current controlling structure 140 (as illustrated in FIG. 2D).

Figure 2F:
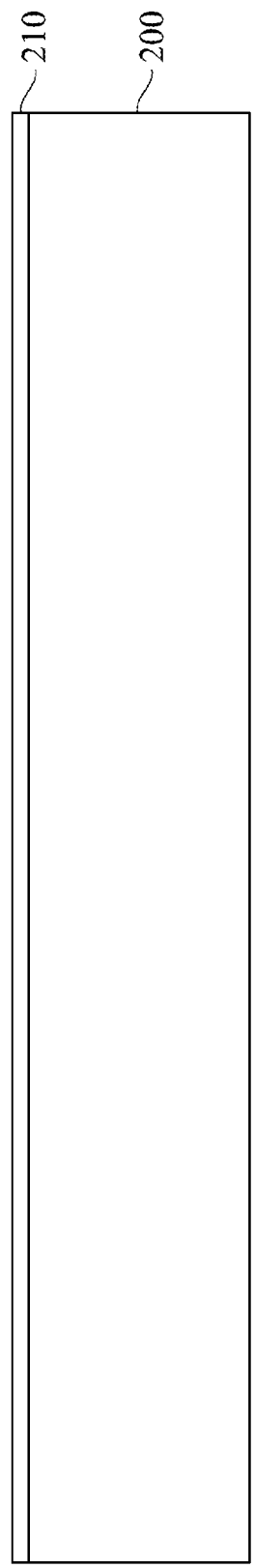
Figure 2G:
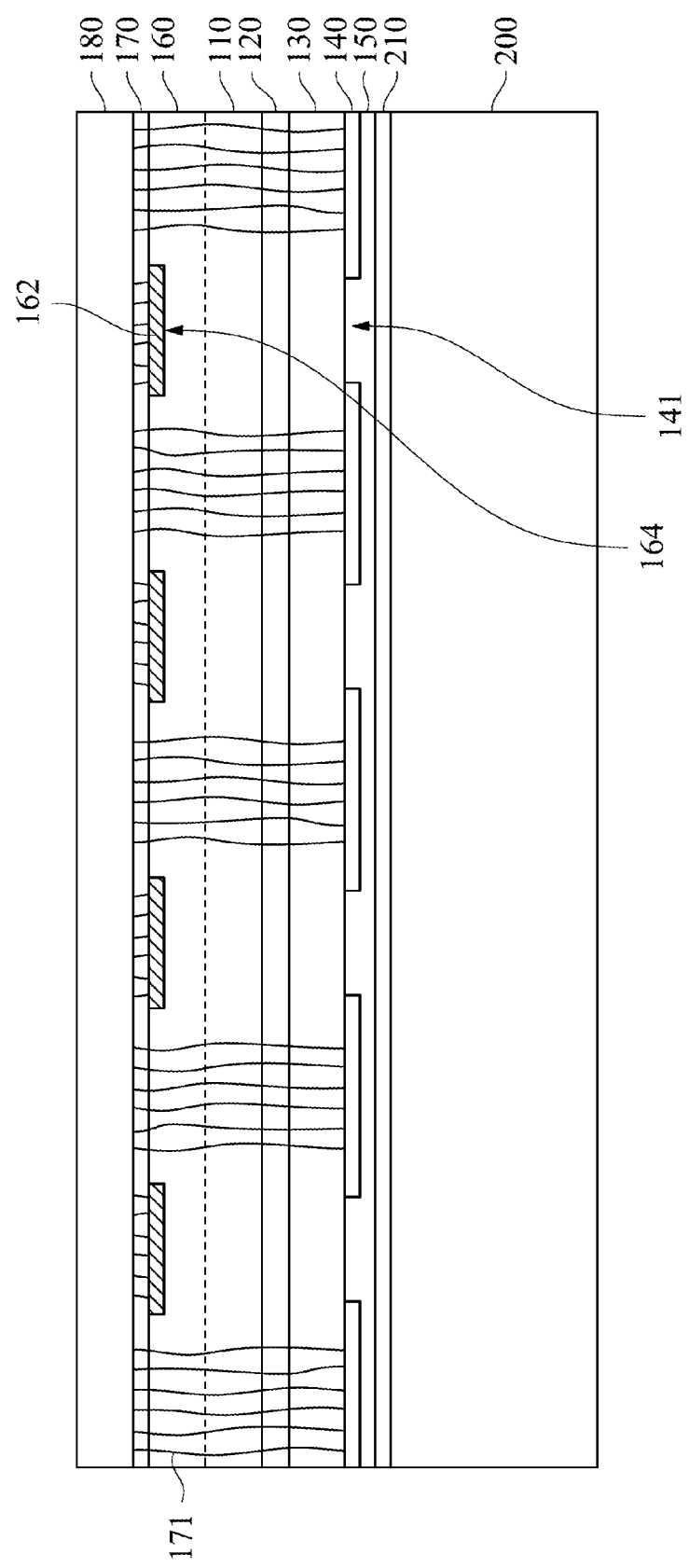

As shown in FIGS. 2F and 2G, a combination of the first type semiconductor layer 110, the active layer 120, the second type semiconductor layer 130, the first current controlling structure 140, and the electrode layer 150 grown on the substrate 180 is subsequently transferred to a carrier substrate 200 before chipped. However, in some embodiments, the combination of the first type semiconductor layer 110, the active layer 120, the second type semiconductor layer 130, the first current controlling structure 140, and the electrode layer 150 may be chipped prior to transfer to a carrier substrate 200.

Furthermore, The carrier substrate 200 has an adhesive layer 210 thereon, in which the combination is bonded with the carrier substrate 200 through the adhesive layer 210. Accordingly, embodiments of the present disclosure may be implemented in a multitude of variations during formation of an array of LEDs 100A for subsequent transfer to the another substrate (not illustrated). For example, in FIG. 2G, the combination is bonded with the carrier substrate 200 with connecting the electrode layer 150 and the carrier substrate 200.

In the other embodiments, the combination is bonded with the carrier substrate 200 with connecting the carrier substrate 200 and a side of the combination opposite to the electrode layer 150. In this case, the combination is bonded with the carrier substrate 200 after removing the substrate 180. In addition, after removing the substrate 180, the buffer layer 170 or/and the ELOG layer 160 can be removed before bonding the combination and the carrier substrate 200, but are not limited thereto.

In an embodiment, an adhesive layer 210 may have a thickness of approximately 0.1 μm-100 μm. The adhesive layer 210 may be made of adhesion capable organic or non-organic materials, e.g., UV curable glue or silicone. The adhesive layer 210 may be formed from a material which is capable of adhering the combination of the first type semiconductor layer 110, the active layer 120, the second type semiconductor layer 130, the first current controlling structure 140, and the electrode layer 150 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof. Referring now to FIG. 2G, the combination of the first type semiconductor layer 110, the active layer 120, the second type semiconductor layer 130, the first current controlling structure 140, and the electrode layer 150 and the carrier substrate 200 may be bonded together by using the adhesive layer 210.

Figure 2H:
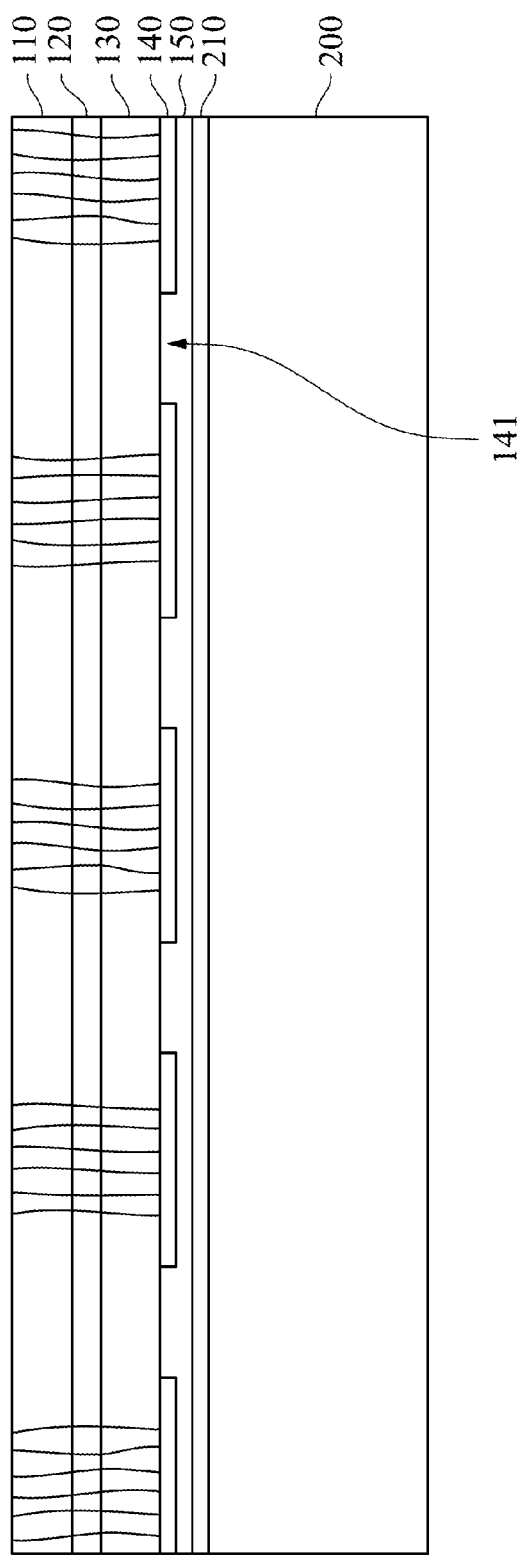

As shown in FIG. 2H, the substrate 180, the buffer layer 170 and the ELOG layer 160 have been removed from the bonded structure illustrated in FIG. 2G. The substrate 180 may be removed by a suitable method such as chemical lift-off or laser lift-off (LLO). Moreover, a predetermined amount of the buffer layer 170 and the ELOG layer 160 or a portion of the first type semiconductor layer 110 are removed, and an operable p-n diode remains after thinning.

In some embodiments, the buffer layer 170 and the ELOG layer 160 can be fully etched. After the buffer layer 170 and the ELOG layer 160 are fully etched, the voids 164 illustrated in FIG. 2G are also removed. Alternatively, the buffer layer 170 and the ELOG layer 160 can be partially etched to form contact holes (not illustrated) via, and the first type semiconductor layer 110 can be electrically coupled with other layer by the contact holes. In other embodiments, the buffer layer 170 is fully etched, and the ELOG layer 160 is partially etched to form the contact holes.

In addition, in the embodiments the buffer layer 170 is omitted, the operation of removing the buffer layer 170 can be omitted. Depending upon the underlying structure, the thinning process may be optionally performed utilizing suitable techniques such as dry etching to etch the buffer layer 170 and the ELOG layer 160.

Furthermore, in some embodiments that the buffer layer 170 and the ELOG layer 160 are fully removed, the dislocation-controlling feature 162 is also removed from the combination of the first type semiconductor layer 110, the active layer 120, the second type semiconductor layer 130, the first current controlling structure 140, and the electrode layer 150. Moreover, after the buffer layer 170 and the ELOG layer 160 are removed, the first type semiconductor layer 110 can be thinned down to the desirable thickness.

Figure 2I:
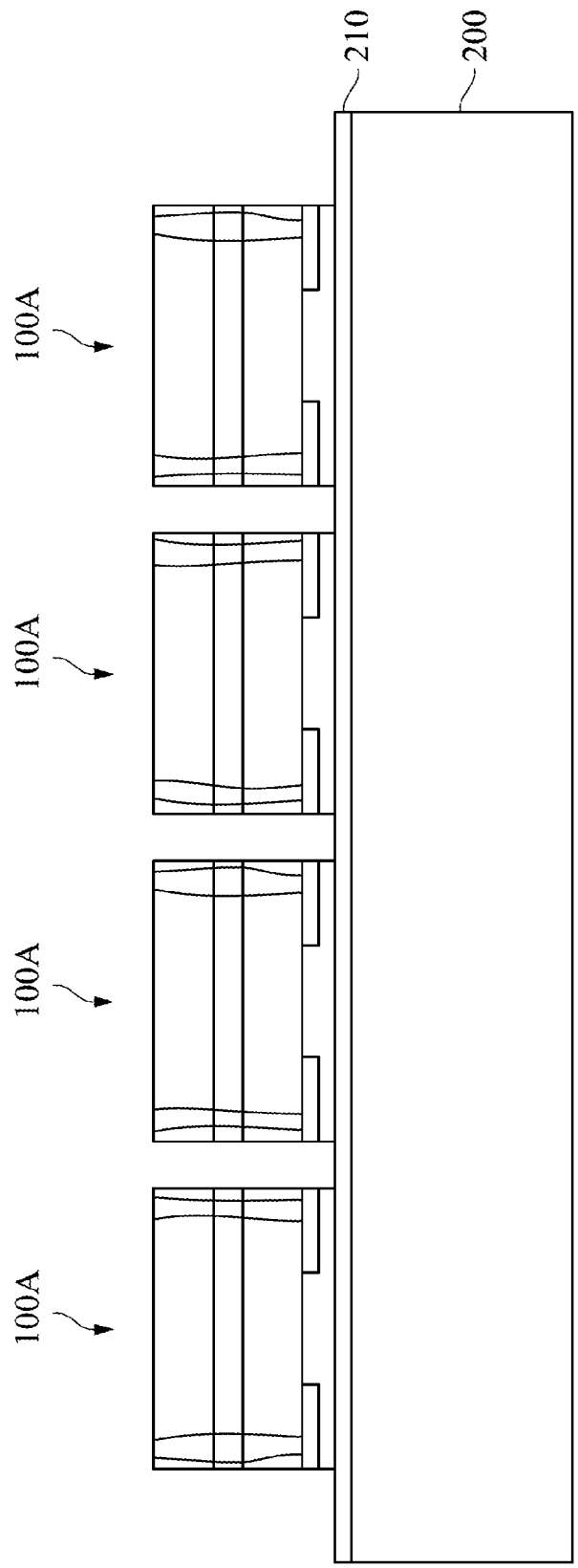

As shown in FIG. 2I, the plurality of the LEDs 100A are positioned over the adhesive layer 210. In some embodiments, LEDs 100A have vertical sidewalls. For example, ICP (Inductively Coupled Plasma) which a chlorine-based etch chemistry may be utilized to obtain vertical sidewalls.

In addition, in the LEDs 100A illustrated in FIG. 2I, the buffer layer 170, the dislocation-controlling feature 162, and the ELOG layer 160 are removed. In other embodiments, the LEDs 100A may have at least one of the buffer layer 170 and the ELOG layer 160 with the contact holes.

Figure 2J:
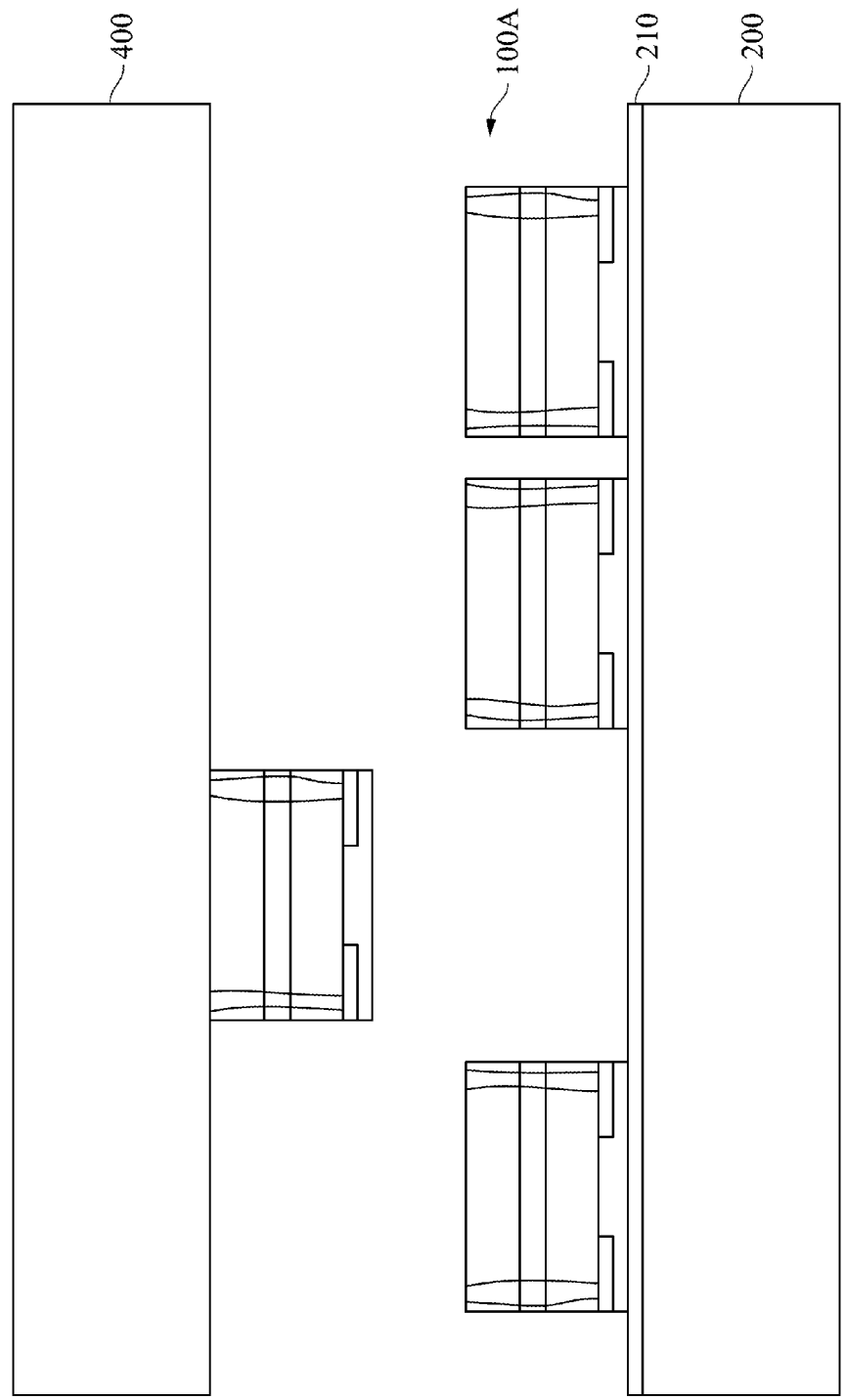

As shown in FIG. 2J, the LED 100A or array of LEDs 100A in FIG. 2J are poised for pick up and transfer by, for example, a transfer head 400. Moreover, the LED 100A or array of LEDs 100A in FIG. 2J can be transferred to a receiving substrate (not illustrated).

A variety of suitable transfer heads can be utilized to aid in the pick up and placement operations according to embodiments of the present disclosure. For example, the transfer head 400 may exert a pick up force on the LED 100A according to vacuum, magnetic, adhesion, or electrostatic attraction in order to pick up the LED 100A.

Referring back to FIG. 1A. In some embodiments, the active layer 120 is made of, for example, heterostructure or quantum well structure. The first current controlling structure 140 is made of a dielectric material, such as silicon nitride or silicon dioxide. In some embodiments, the first type semiconductor layer 110, the second type semiconductor layer 130 and the active layer 120 may be formed by, for example, epitaxy, such as metal-organic chemical vapor deposition (MOCVD). The first current controlling structure 140 may be formed by, for example, physical vapor deposition (PVD). In some embodiments, the active layer 120 can be omitted. In the embodiments that the active layer 120 is omitted, the second type semiconductor layer 130 is directly disposed on the first type semiconductor layer 110.

In some embodiments, the first type semiconductor layer 110 may have a thickness of approximately 0.1 μm-50 μm. The active layer 120 (which may be SQW or MQW) may have a thickness approximately 50 nm-5 μm. The second type semiconductor layer 130 may have a thickness of approximately 50 nm-20 μm, In some embodiments, the first type semiconductor layer 110 and the second type semiconductor layer 130 form a first p-n junction, the first current controlling structure 140 and the second type semiconductor layer 130 form a second p-n junction, and the electrode layer 150 and an electrode of the receiving substrate receiving the LED 100A by the transfer head 400 are configured to forward bias the first p-n junction while reverse bias the second p-n junction.

In some embodiments, the first type semiconductor layer 110 and the first current controlling structure 140 are p type semiconductor layers, and the second type semiconductor layer 130 is an n type semiconductor layer. In some embodiments, the first type semiconductor layer 110 and the first current controlling structure 140 are n type semiconductor layers, and the second type semiconductor layer 130 is a p type semiconductor layer.

In some embodiments, the first type semiconductor layer 110 and the second type semiconductor layer 130 form a p-n junction, the first current controlling structure 140 and the second type semiconductor layer 130 form a Schottky barrier. In some embodiments, the second type semiconductor layer 130 may consisted of heavily Mg-doped p-GaN or moderately Mg-doped p-GaN, for example. To fabricate the first current controlling structure 140, an Ar$^+$ plasma treatment on the second type semiconductor layer 130 was performed using a predetermined working pressure, radio frequency power, and a predetermined process time. The Schottky barrier were first fabricated on the treated surfaces of the second type semiconductor layer 130 using an Ni/Ag/Pt ohmic contact as the electrode layer 150. It is evident that the bias current of the Ni/Ag/Pt contact formed on the plasma-treated surfaces of the second type semiconductor layer 130 are nearly zero in the measured voltage range from −1 to 5V, while the plasma-untreated surfaces of the second type semiconductor layer 130 shows ohmic behavior. That is, the Ar$^+$ plasma treatment to the second type semiconductor layer 130 led to the formation of a large barrier height. As a result, no current will flow through the part of the active layer 120 corresponding to the first current controlling structure 140, so that the part of the active layer 120 is prevented from emitting light.

In some embodiments, the second type semiconductor layer 130 has the resistivity $\rho_2$, the first current controlling structure 140 is a high resistivity layer which has a resistivity $\rho_h$, and $\rho_h > \rho_2$. For example, $\rho_h$ may be over 10 times greater than $\rho_2$, but the present disclosure is not limited in this regard. In some embodiments, the first current controlling structure 140 can be a semiconductor layer lighter doped or un-doped respect to the second type semiconductor layer 130, a semi-metal layer, a ceramic layer, or a semi-insulator layer. As a result, the first current controlling structure 140 can control most of the current to flow through the first current-injecting zone 141 of the first current controlling structure 140, so as to limit the emitting area of the active layer 120 at a part corresponding to the first current-injecting zone 141 as possible. For example, under the circumstances that the resistivity $\rho_h$ of the first current controlling structure 140 is 10 times greater than the resistivity $\rho_2$ of the second type semiconductor layer 130, it can result higher current density into the first current-injecting zone 141 having relatively small area, so as to achieve the purpose of current control. Thus, the current density of the current-injecting zone area is higher comparing to the other region.

In some embodiments, the first type semiconductor layer 110 is an n type semiconductor layer, the second type semiconductor layer 130 is a p type semiconductor layer, and the first current controlling structure 140 is a hole blocking layer. The LUMO (Lowest Unoccupied Molecular Orbital) energy level of the first current controlling structure 140 is lower than that of the second type semiconductor layer 130 for at least 0.2 eV, so as to block holes transporting from the second type semiconductor layer 130 to the active layer 120. As a result, the holes in the second type semiconductor layer 130 can only transport to the active layer 120 via the first current-injecting zone 141 of the first current controlling structure 140. For example, the material of the first current controlling structure 140 can be AlxGayN$_{(1-x-y)}$ with superlattice structure.

In some embodiments, the first type semiconductor layer 110 is a p type semiconductor layer, the second type semiconductor layer 130 is an n type semiconductor layer, and the first current controlling structure 140 is an electron blocking layer. The HOMO (Highest Occupied Molecular Orbital/ Conduction band) energy level of the first current controlling structure 140 is higher than that of the second type semiconductor layer 130 for at least 0.2 eV, so as to block electrons transporting from the second type semiconductor layer 130 to the active layer 120. As a result, the electrons in the second type semiconductor layer 130 can only transport to the active layer 120 via the first current-injecting zone 141 of first current controlling structure 140. For example, the material of the first current controlling structure 140 can be AlxGayN$_{(1-x-y)}$ with superlattice structure.

Figure 3A:
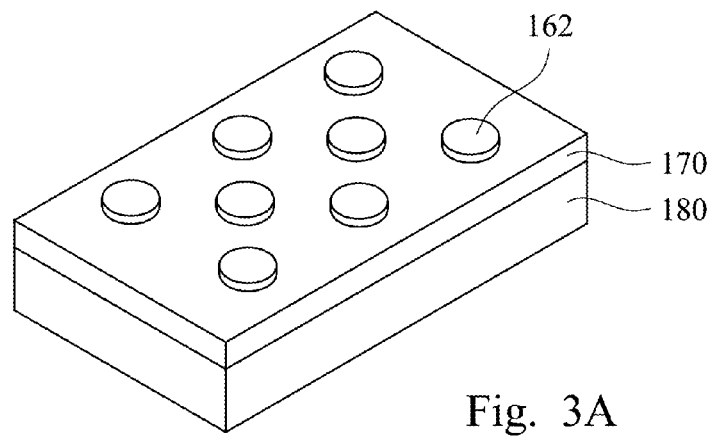
FIG. 3A-3E are perspective views of the dislocation-controlling features with various shape according to various embodiments of the present disclosure.
Figure 3B:
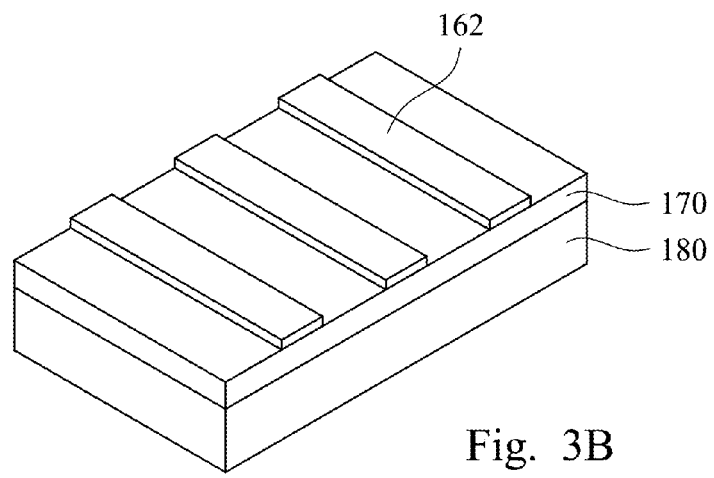
Figure 3C:
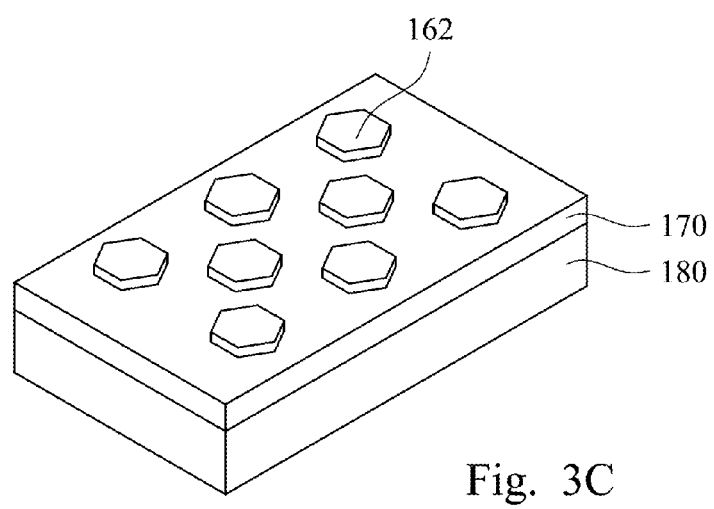
Figure 3D:
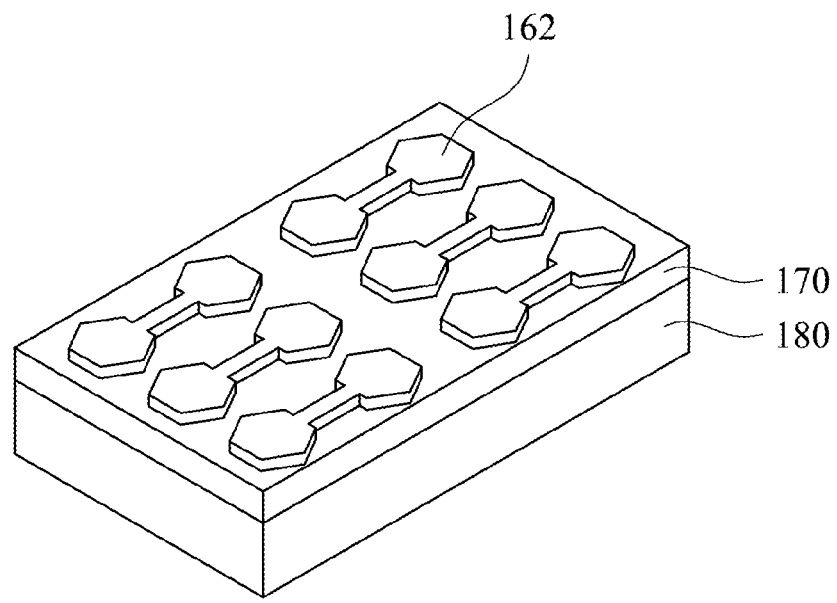
Figure 3E:
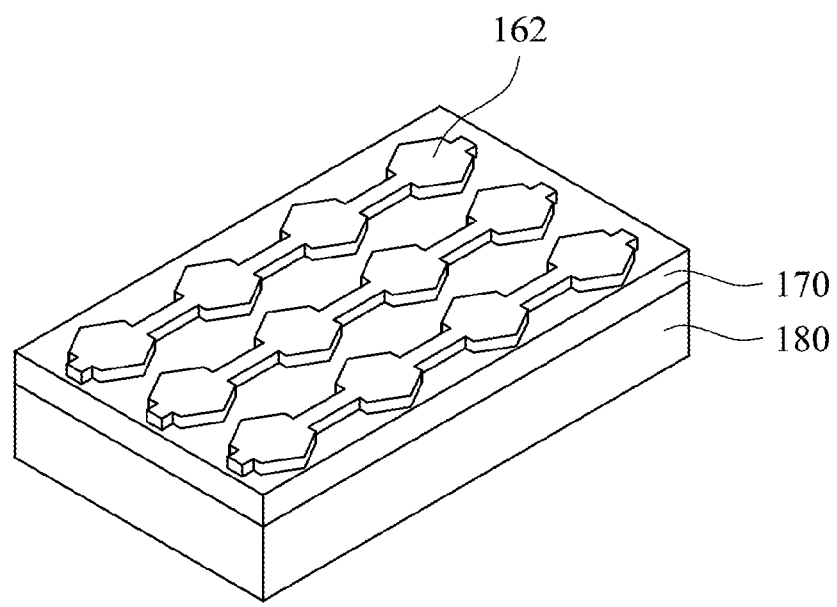

In various embodiments of the present disclosure, the dislocation-controlling feature 162 discussed above may have variety of shapes. For example, FIGS. 3A-3E are perspective views of dislocation-controlling features 162 with various shape according to various embodiments of the present disclosure. As shown in FIGS. 3A-3E, the dislocation-controlling feature 162 may be strip-shaped, zig-zag shaped, circular or polygonal. For example, the dislocation-controlling features 162 shown in FIG. 3A are circular, the dislocation-controlling features 162 shown in FIG. 3B are strip-shaped, the dislocation-controlling features 162 shown in FIGS. 3C and 3D are polygonal, and the dislocation-controlling features 162 shown in FIG. 3E may be a patterned interlayer. In addition, the two polygons of the dislocation-controlling feature 162 shown in FIG. 3D are connected to each other, and the two adjacent polygons of the patterned interlayer of the dislocation-controlling features 162 shown in FIG. 3E are connected to each other so as to form a number of rows of the polygons.

As previously described, the position of each of the dislocation-controlling features 162 on the buffer layer 170 and the substrate 180 can be determined relatively to the position of the first current-injecting zone 141 (see FIG. 1A). However, the shape of each of the dislocation-controlling features 162 and the shape of first current-injecting zone 141 (see FIG. 1A) are individual to each other. For example, the shape of each of the dislocation-controlling features 162 can be polygonal, and the shape of first current-injecting zone 141 (see FIG. 1A) can be circular.

In various embodiments of the present disclosure, a plurality of the dislocation-controlling features 162 discussed above may be substantially equally or unequally spaced. Furthermore, whether the dislocation-controlling features 162 are equally spaced or unequally spaced, in various embodiments, the pitch between the adjacent two of the dislocation-controlling features 162 is in a range from about 0.5 µm to about 20 µm.

Figure 4:
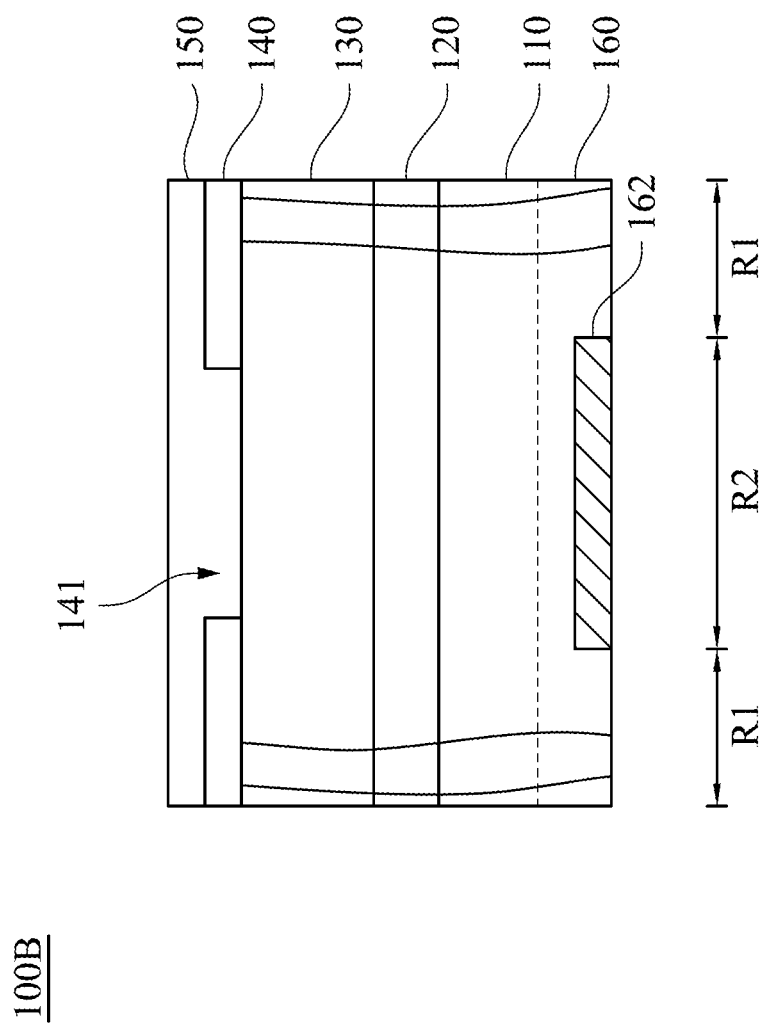
FIG. 4 is a cross-sectional view of an LED according to a second embodiment of the present disclosure.

FIG. 4 is a cross-sectional view of an LED 100B according to a second embodiment of the present disclosure. The difference between the present embodiment and the first embodiment is that the dislocation-controlling feature 162 is reflective.

As shown FIG. 4, since the dislocation-controlling feature 162 is reflective, the lights can be reflected upwardly by the dislocation-controlling feature 162. Therefore, the light extraction efficiency of the LED 100B can be enhanced. More specifically, when the lights pass through the interface between the LED 100B and the air, some of lights are reflected back to the LED 100B due to total internal reflection. The lights totally reflected at the LED/air interface may back to the dislocation-controlling feature 162, and those lights can get second reflection by the dislocation-controlling feature 162. Then, some of lights may have chance to escape from the LED 100B at the LED/air interface, and the remaining lights may be totally reflected back to the dislocation-controlling feature 162 and go through the reflection process again. Thus, after multiple reflections, most of the lights can escape from the LED 100B into the air, and thus the light extraction efficiency of LED 100B can be enhanced.

Furthermore, in the present embodiment, the dislocation-controlling feature 162 may be a micro mirror array (MMA). More specifically, the dislocation-controlling feature 162 may be made of conductive material, such as metal or metal alloys. In addition, in some embodiments that the dislocation-controlling feature 162 is made of the conductive material, the conductive material may not diffuse into the semiconductor layer in a process in high temperature, such that the substance of the dislocation-controlling feature 162 may not diffuse into the first type semiconductor layer 110 in the manufacturing processes. Alternatively, the dislocation-controlling feature 162 may be made of dielectric materials.

Figure 5A:
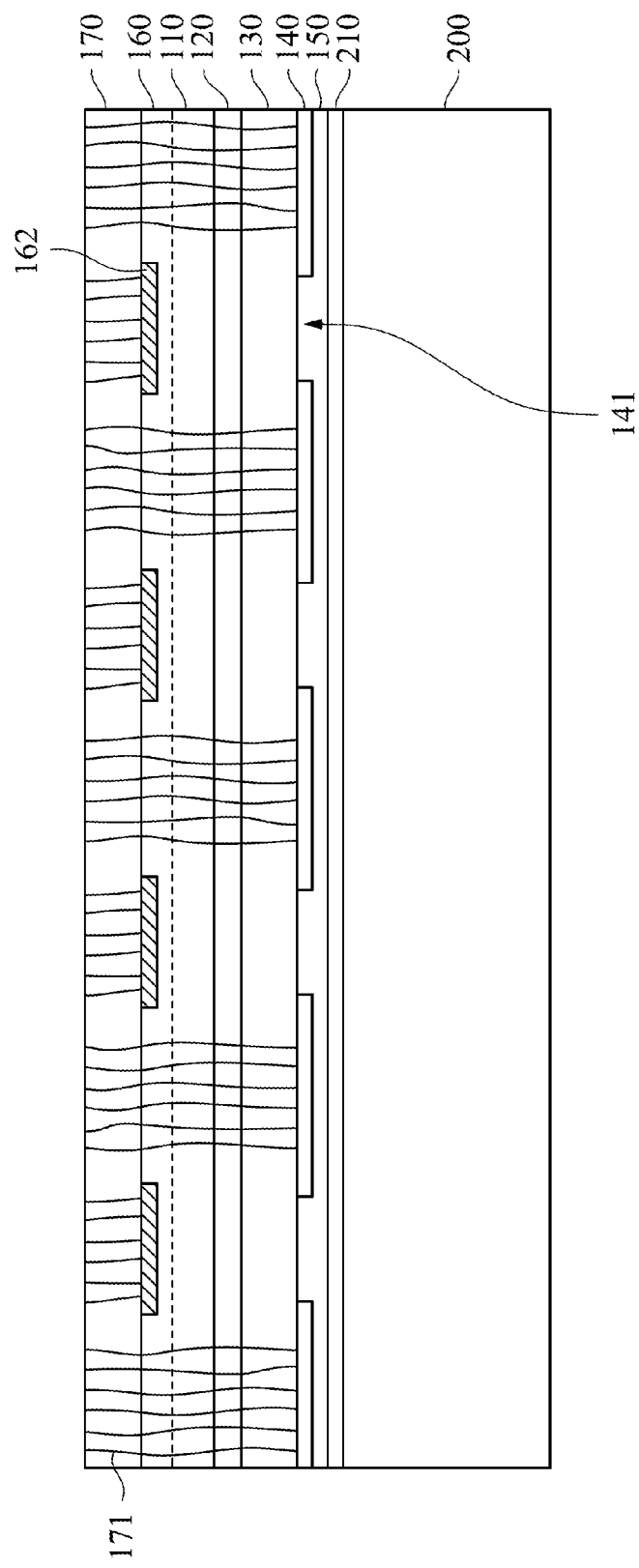
FIGS. 5A and 5B are cross-sectional views of a method for manufacturing the LED illustrated in FIG. 4.
Figure 5B:
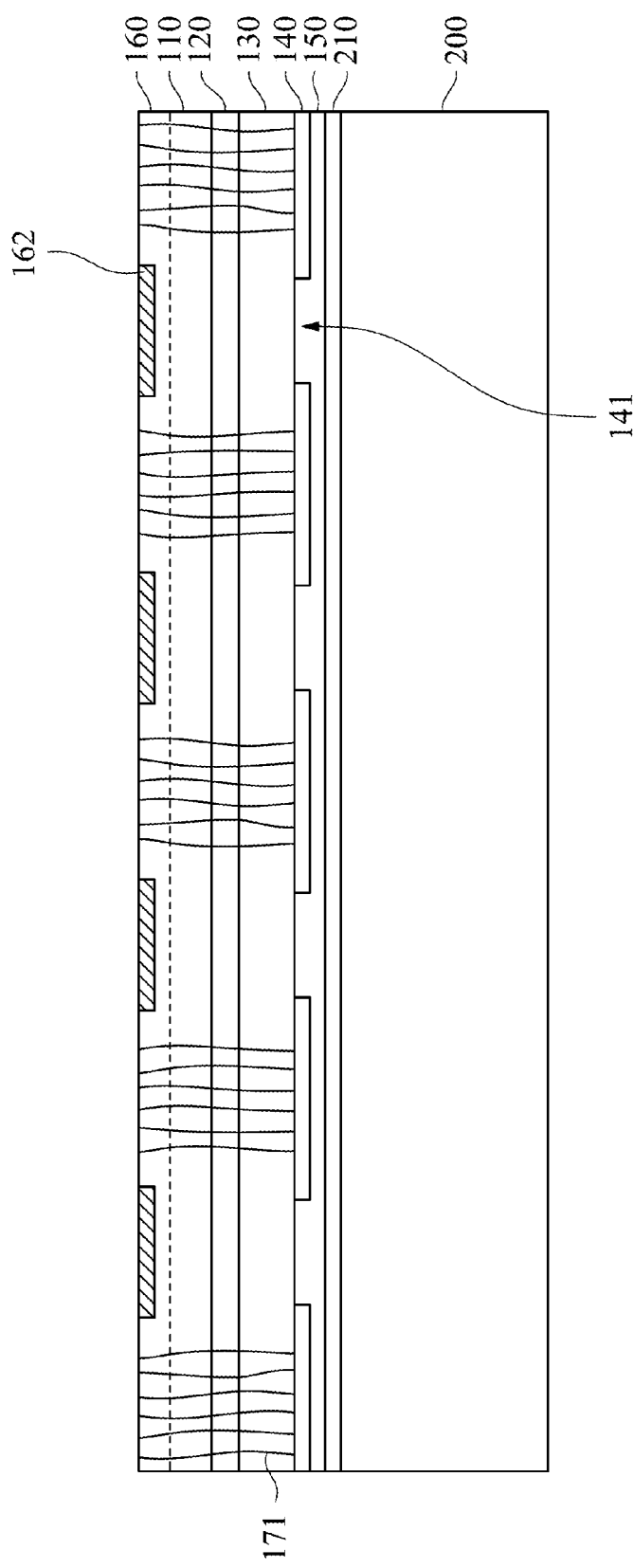

Next, a method for manufacturing an LED 100B illustrated in FIG. 4 is provided. The LED 100B illustrated in FIG. 4 can be manufactured according to operations sequentially illustrated by FIGS. 5A and 5B, in which FIGS. 5A and 5B are cross-sectional views of a method for manufacturing the LED 100B illustrated in FIG. 4. In addition, since the manufacturing processes of the LED 100B illustrated in FIG. 4 before the operations illustrated in FIGS. 5A and 5B are similar to those in the operations illustrated in FIGS. 2A-2G, they are not repeated herein.

As shown in FIGS. 5A and 5B, a combination of a first type semiconductor layer 110, an active layer 120, a second type semiconductor layer 130, a first current controlling structure 140, and an electrode layer 150 is transferred to a carrier substrate 200 before chipped the same as the first embodiment. The difference between the present embodiment illustrated in FIG. 5B and the first embodiment is that a reflective dislocation-controlling feature 162 is remained. As the previously described, the light extraction efficiency of the LED 100B (see FIG. 4) can be enhanced through this remained reflective dislocation-controlling feature 162. In addition, the processes configured to removing a buffer layer 170 and an ELOG layer 160 are the same as the first embodiment, they are not repeated herein. After removing the buffer layer 170 and the ELOG layer 160, the structure illustrated in FIG. 5B is etched to form the LEDs 100B illustrated in FIG. 4.

FIG. 6 is a cross-sectional view of an LED 100C according to a third embodiment of the present disclosure. The difference between the present embodiment and the first embodiment is that a first region R1 and a second region R2 of a first type semiconductor layer 110 are formed by different processes (different from the processes described as the first embodiment).

Similarly, in the first type semiconductor layer 110, the first region R1 has a first threading dislocation density, the second region R2 has a second threading dislocation density, and the first threading dislocation density is greater than the second threading dislocation density. In the present embodiment, the LED 100C illustrated in FIG. 6 can be manufactured according to operations sequentially illustrated by FIGS. 7A-7D, in which FIGS. 7A-7D are cross-sectional views of a method for manufacturing the LED 100C illustrated in FIG. 6.

Figure 7A:
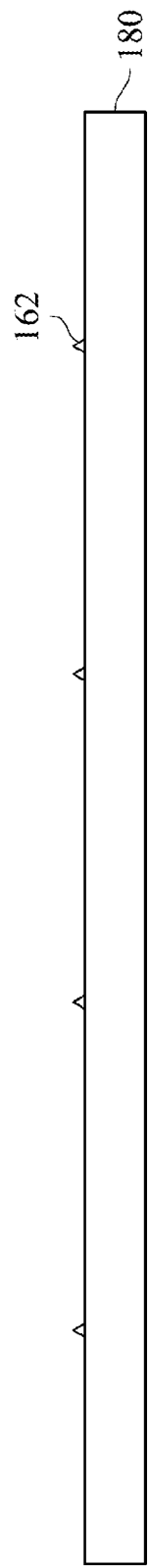
FIGS. 7A-7D are cross-sectional views of a method for manufacturing the LED illustrated in FIG. 6.
Figure 7B:
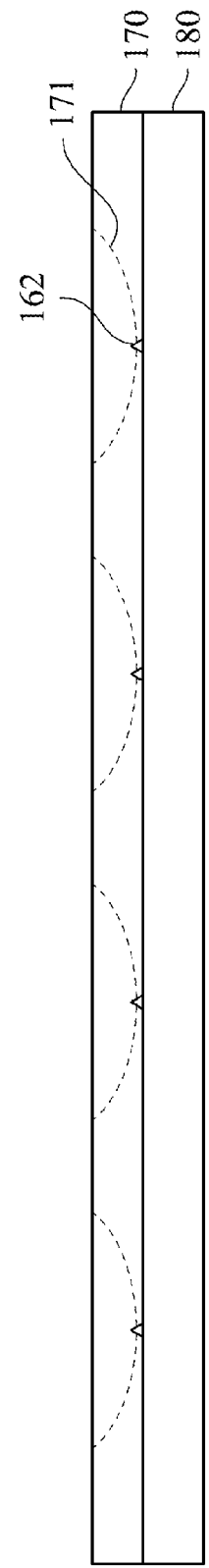

As shown in FIGS. 7A and 7B, dislocation-controlling features 162 are formed on a substrate 180, in which each of the dislocation-controlling features 162 of the present embodiment is a dislocation-reduction feature. Then, a buffer layer 170 is formed on the substrate 180 and the dislocation-controlling features 162. Since the lattice mismatch is created between the substrate 180 and a layer (the buffer layer 170) on the substrate 180, a tensile stress is produced followed by formation of the layer. The tensile stress is produced especially in the places where the dislocation-controlling features 162 located, and thus, the threading dislocations 171 tend to originate from the dislocation-controlling features 162. Explained in a different way, the substrate 180 has at least one dislocation-controlling feature 162 thereon, and the threading dislocations 171 originate from the dislocation-controlling features 162. More specifically, the threading dislocations 171 originate from the dislocation-controlling features 162 and propagate obliquely due to the tensile stress.

Furthermore, in some embodiments, the substrate 180 may be a patterned sapphire substrate, and the dislocation-controlling features 162 is a pattern on the patterned sapphire substrate. In other embodiments, the substrate 180 may be made of, for example, Si, SiC, ZnO, InP, AlN, GaP, and GaN, etc. The buffer layer 170 is made of a doped or undoped material such as GaN, AlN, AlGaN, InGaN, and InAlGaN, etc., so as to reduce the lattice mismatch with the substrate 180. Similarly, the dislocation-controlling features 162 can be substantially equally or unequally spaced.

Figure 7C:
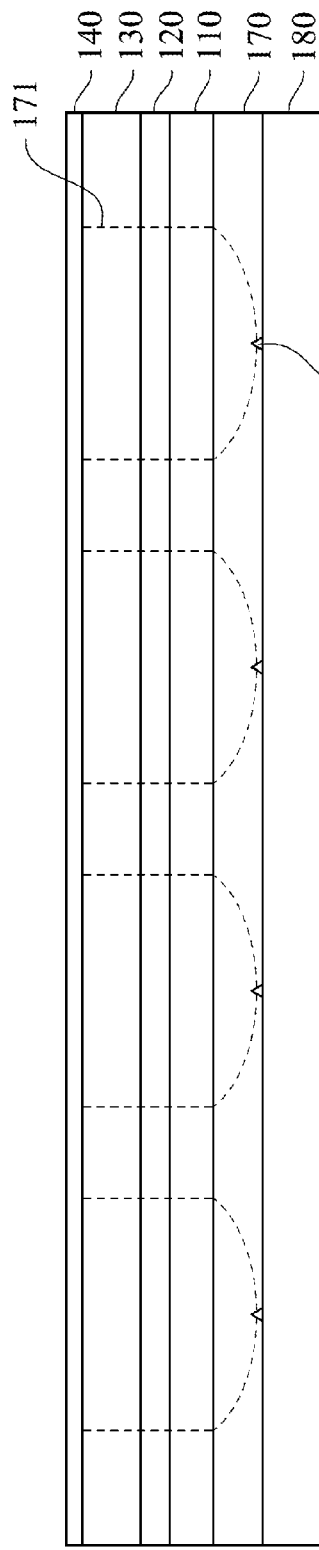

As shown in FIG. 7C, a first type semiconductor layer 110 is formed on the dislocation-controlling features 162, the buffer layer 170, and the substrate 180. An active layer 120 is formed on the first type semiconductor layer 110. A second type semiconductor layer 130 is formed on the active layer 120 and the first type semiconductor layer 110. A current controlling structure 140 joined with the second type semiconductor layer 130 is formed on the second type semiconductor layer 130. In addition, since the sequent processes, the material, and the detailed structure are the same as those in the first embodiment, they are not repeated herein.

With the dislocation-controlling features 162, since the threading dislocations 171 propagate obliquely from the dislocation-controlling features 162, the threading dislocations 171 propagate into the layers formed on the buffer layer 170. Therefore, the first region R1 (see FIG. 6) with the first threading dislocation density and the second region R2 (see FIG. 6) with the second threading dislocation density in the first type semiconductor layer 110 are formed, in which the first threading dislocation density is greater than the second threading dislocation density.

Figure 7D:
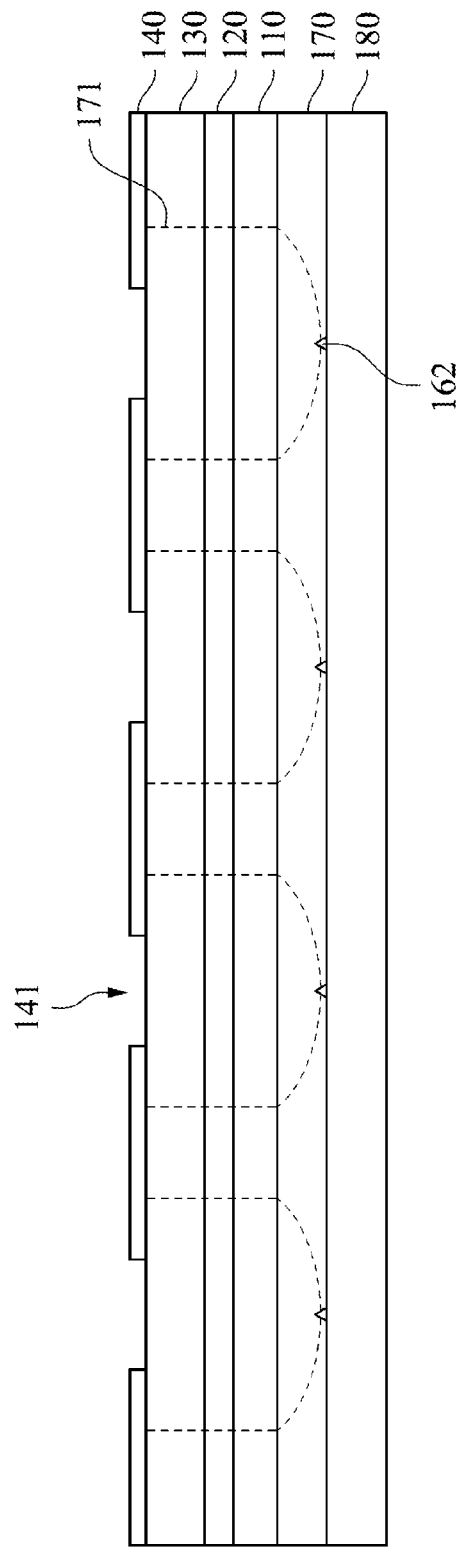

As shown in FIG. 7D, a plurality of first current-injecting zones 141 are formed within the first current controlling structure 140. Similarly, a vertical projection of each of the first current-injecting zones 141 on the first type semiconductor layer 110 at least partially overlaps with the second region R2 (see FIG. 6). Therefore, the current flowing the active layer 120 can go into the region with the lower threading dislocation density.

Then, the structure illustrated in FIG. 7D is transferred and chipped in the sequent processes, and other details regarding the structure illustrated in FIG. 7D are similar to the first embodiment and therefore are not repeated here to avoid duplicity. Moreover, in some embodiments, the buffer layer 170 is omitted, and the substrate 180 is joined with the first type semiconductor layer 110. In the embodiments that the buffer layer 170 is omitted, the dislocation-controlling features 162 is between the substrate 180 and the first type semiconductor layer 110. Furthermore, after the formation of the structure illustrated in FIG. 7D (thus, LEDs are formed), the substrate 180 and the dislocation-controlling features 162 can be removed by, for example, chemical lift-off or LLO (Laser lift-off), in which a portion of the first type semiconductor layer 110 may removed with the dislocation-controlling features 162.

FIG. 8 is a cross-sectional view of an LED 100D according to a fourth embodiment of the present disclosure. The difference between the present embodiment and the first embodiment is that the dislocation-controlling feature 162 is remained within the first type semiconductor layer 110. In some embodiments, the first type semiconductor layer 110 has a first part 110*a* and a second part 110*b*, in which the dislocation-controlling feature 162 is disposed between the first part 110*a* and the second part 110*b* of the first type semiconductor layer 110. In addition, in order to facilitate the descriptions, a dot line is illustrated between the first part 110*a* and the second part 110*b* of the first type semiconductor layer 110. Under this configuration, the first part 110*a* and the second part 110*b* can be manufactured in the same process or different processes and be made of the same material or different materials. In addition, the dislocation-controlling feature 162 can be made of a conductive material.

Similarly, in the first type semiconductor layer 110, the first region R1 has a first threading dislocation density, the second region R2 has a second threading dislocation density, and the first threading dislocation density is greater than the second threading dislocation density. In addition, the vertical projection of the dislocation-controlling feature 162 on the first current controlling structure 140 at least overlaps the current-injecting zone 141. Moreover, in the present embodiment, the LED 100D illustrated in FIG. 8 can be manufactured according to operations sequentially illustrated by FIGS. 9A-9F, in which FIGS. 9A-9F are cross-sectional views of a method for manufacturing the LED 100D illustrated in FIG. 8.

Figure 9A:
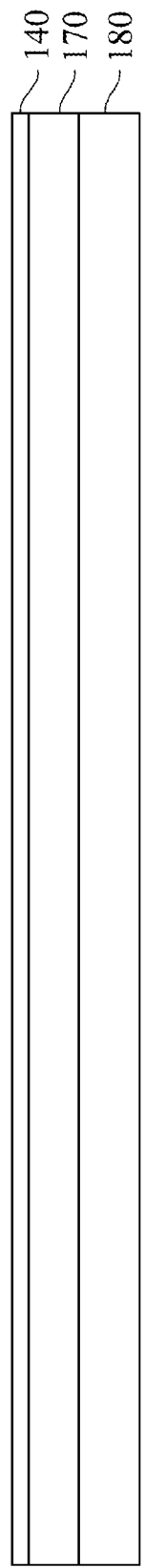
FIGS. 9A-9F are cross-sectional views of a method for manufacturing the LED illustrated in FIG. 8.
Figure 9B:
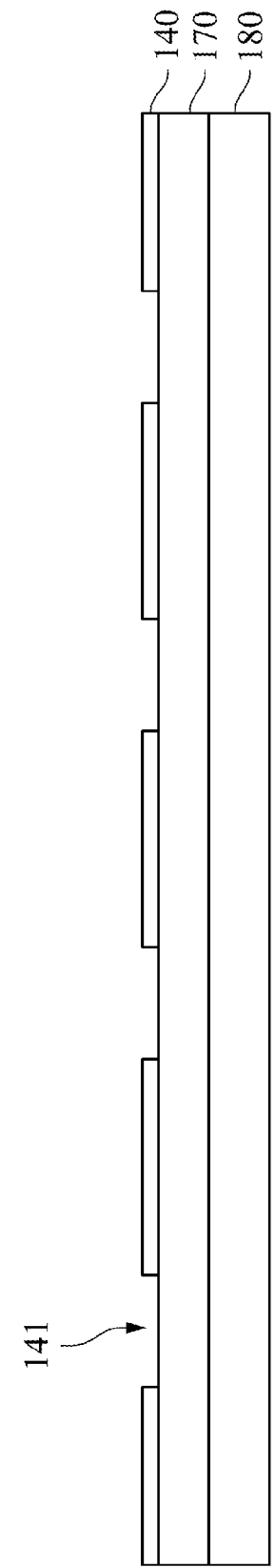

As shown in FIGS. 9A and 9B, a buffer layer 170 is formed on a substrate 180, and then a first current controlling structure 140 is formed on the buffer layer 170. In addition, a plurality of threading dislocations (not illustrated, for example, the threading dislocations 171 mentioned above in FIG. 2A) arise from the lattice mismatch between the substrate 180 and the buffer layer 170, in which the threading dislocations are substantially distributed randomly in the buffer layer 170. Furthermore, the difference between the present embodiments and the first embodiment is that the first current controlling structure 140 is formed before forming dislocation-controlling features 162. Then, a plurality of first current-injecting zones 141 are formed within the first current controlling structure 140. Similarly, the patterned current controlling structure 140 has the current-injecting zones 141 therein.

Figure 9C:
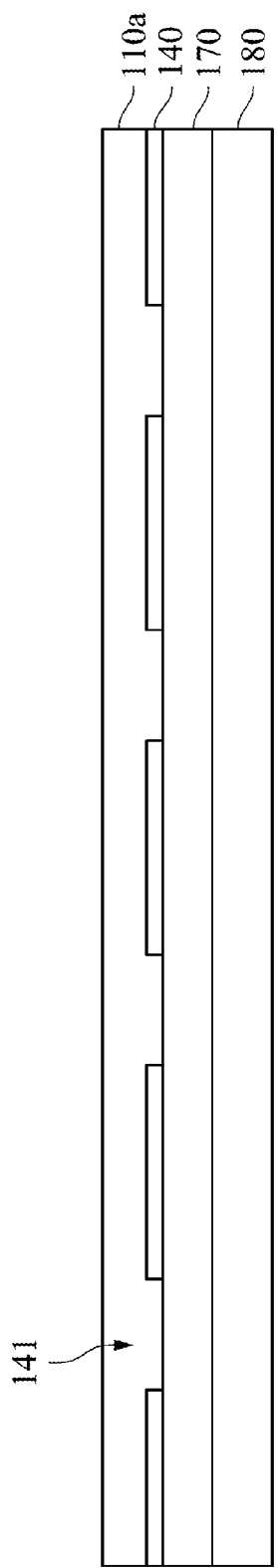
Figure 9D:
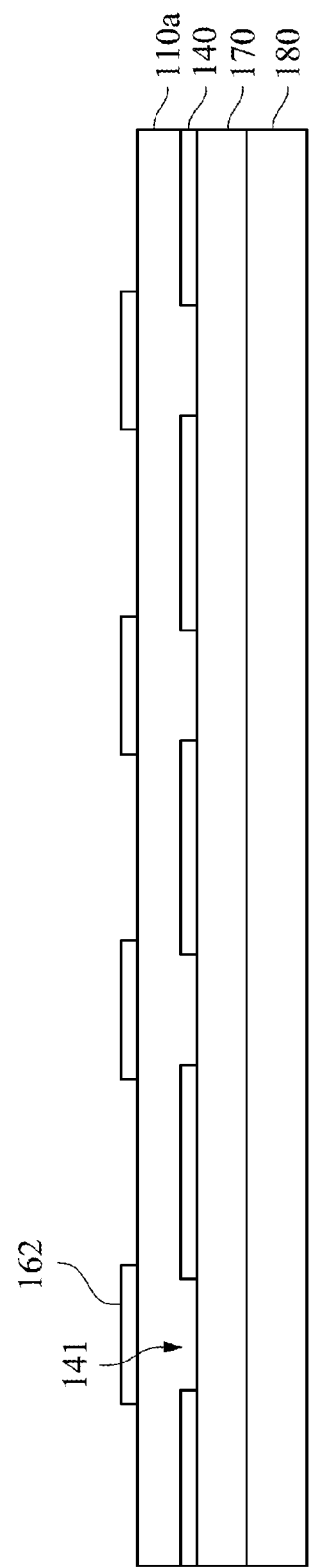

As shown in FIGS. 9C and 9D, a first part 110*a* of a first type semiconductor layer (e.g., the first type semiconductor layer 110 mentioned above in FIG. 8) is formed on the first current controlling structure 140 and the buffer layer 170, and then dislocation-controlling features 162 are formed on the first part 110*a* of the first type semiconductor layer. In the present embodiments, the vertical projections of the dislocation-controlling features 162 on the first current controlling structure 140 at least overlaps the current-injecting zones 141. In other words, the vertical projections of the current-injecting zones 141 on the dislocation-controlling features 162 are respectively present within the dislocation-controlling features 162.

Figure 9E:
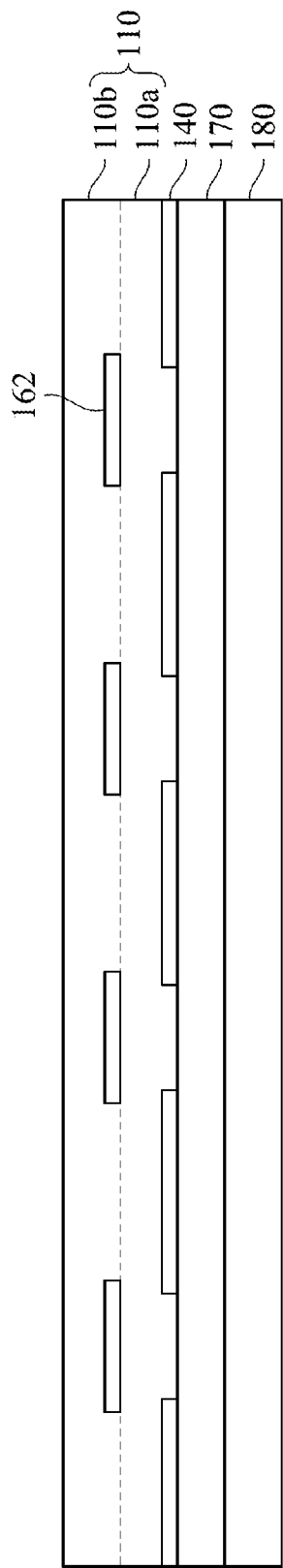
Figure 9F:
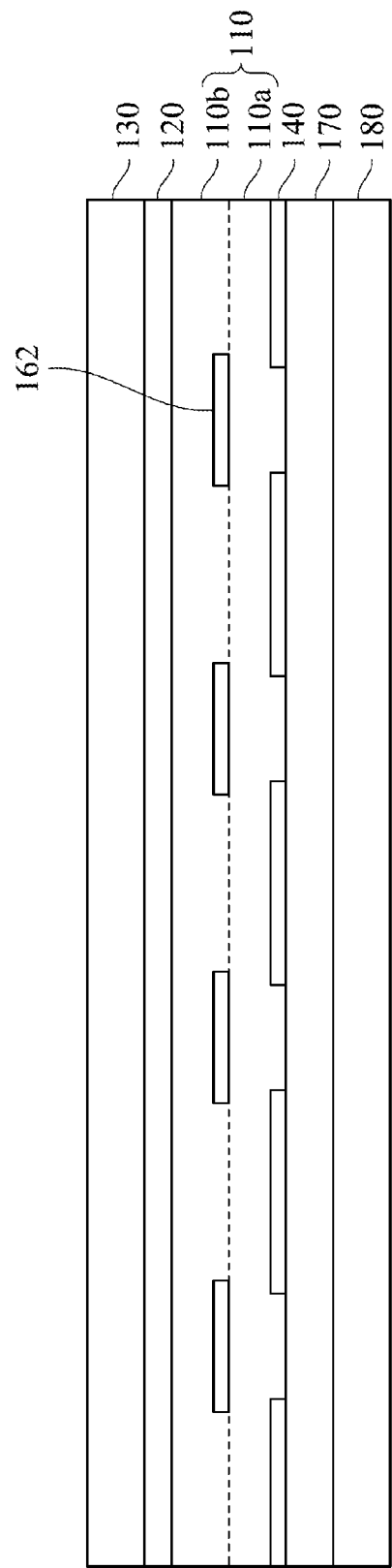

As shown in FIGS. 9E and 9F, a second part 110*b* of the first type semiconductor layer is formed on the first part 110*a* of the first type semiconductor layer to form the first type semiconductor layer 110 on the buffer layer 170 and the substrate 180. As previous described, since the first part 110*a* and the second part 110*b* may belong to the same layer, a dot line is illustrated between the first part 110*a* and the second part 110*b* of the first type semiconductor layer 110. In the first type semiconductor layer 110, since the dislocation-controlling features 162 are capable of blocking the threading dislocations from propagating into the upper layers, the dislocation-controlling features 162 causes first type semiconductor layer 110 to have the first region R1 (see FIG. 8) and the second region R2 (see FIG. 8). The first region R1 has a first threading dislocation density, the second region R2 has a second threading dislocation density, and the first threading dislocation density is greater than the second threading dislocation density. Then, an active 120 is formed on the first type semiconductor layer 110, and then a second type semiconductor layer 130 is formed on the active layer 120 and the first type semiconductor layer 110.

In some embodiments, after a combination of the first current controlling structure 140, the first type semiconductor layer 110, the active layer 120, and the second type semiconductor layer 130 is formed, the combination is transferred to a carrier substrate before chipped the same as the first embodiment, and then the substrate 180 and the buffer layer 170 are removed. Furthermore, in some embodiments, the buffer layer 170 is remained.

According to the above embodiments, the order of the formations of the current controlling structure 140 and the dislocation-controlling features 162 can be changed. Thus, in some embodiments, the formation of the dislocation-controlling features 162 is performed before the formation of the current controlling structure 140. In other embodiments, the formation of the current controlling structure 140 is performed before the formation of the dislocation-controlling features 162.

FIG. 10 is a cross-sectional view of an LED 100E according to a fifth embodiment of the present disclosure. The difference between the present embodiment and the first embodiment is that a first current controlling structure 140 with a first current-injecting zone 141 is disposed within the second type semiconductor layer 130.

As shown in FIG. 10, in the LED 100E of the present embodiment, the first current controlling structure 140 with the first current-injecting zone 141 is disposed between the second type semiconductor layer 130 and the active layer 120, and the first current controlling structure 140 contacts the active layer 120. To manufacture the LED 100E shown in FIG. 10 in which the first current controlling structure 140 is disposed between the second type semiconductor layer 130 and the active layer 120, in FIG. 2C, the formation of the first current controlling structure 140 can be brought forward to be performed after the formation of the active layer 120 and before the formation of the second type semiconductor layer 130. Thus, the first current controlling structure 140 is disposed in at least a part of the second type semiconductor layer 130.

Figure 11:
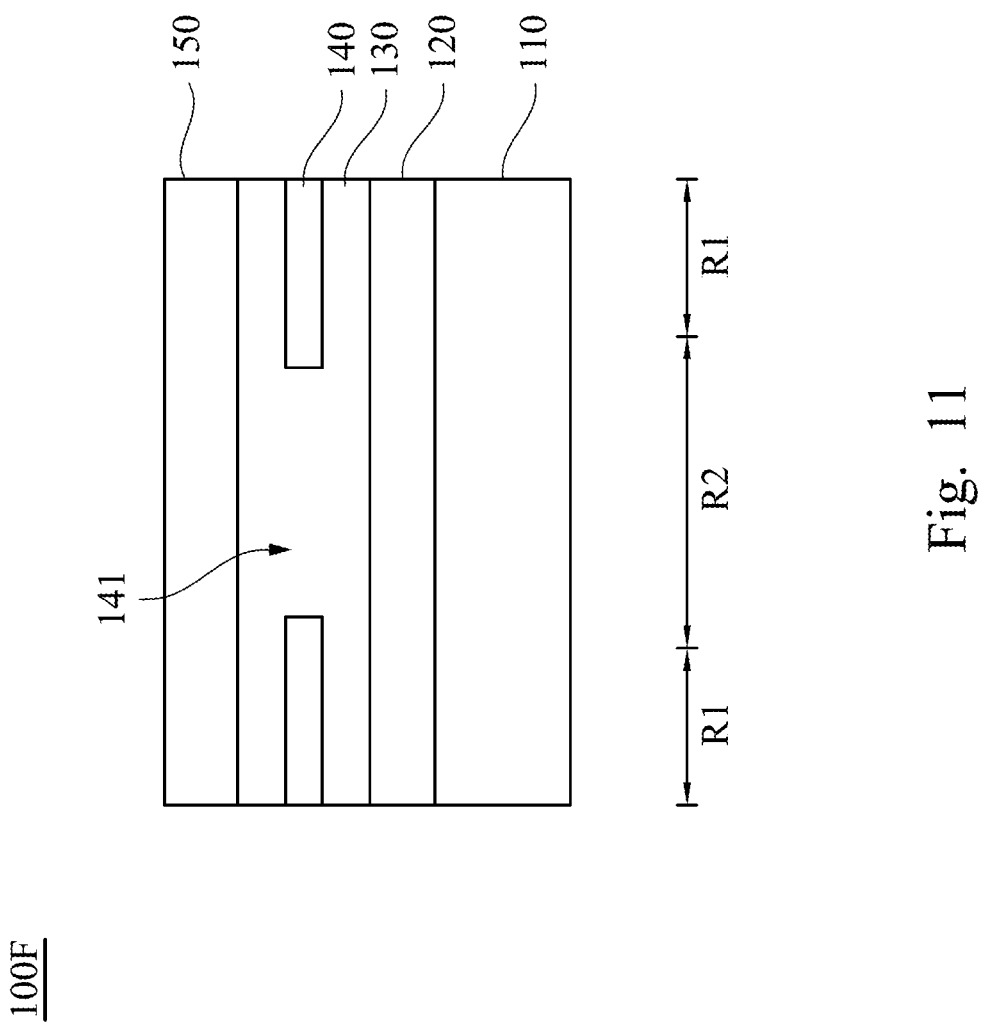
FIG. 11 is a cross-sectional view of an LED according to a sixth embodiment of the present disclosure.

FIG. 11 is a cross-sectional view of an LED 100F according to a sixth embodiment of the present disclosure. The difference between the present embodiment and the fifth embodiment is that a first current controlling structure 140 with a first current-injecting zone 141 is disposed in the second type semiconductor layer 130 without contacting the active layer 120. Thus, the first current controlling structure 140 with the first current-injecting zone 141 is separated from the active layer 120 by at least a part of the second type semiconductor layer 130.

Under this configuration, the second type semiconductor layer 130 may protect the active layer 120 while manufacturing the first current controlling structure 140. To manufacture the LED 100F shown in FIG. 11 in which the first current controlling structure 140 with the first current-injecting zone 141 is disposed in the second type semiconductor layer 130, in FIG. 2C, the formation of the first current controlling structure 140 can be brought forward to be performed during the formation of the second type semiconductor layer 130. For example, the first current controlling structure 140 can be formed after forming 10% of the second type semiconductor layer 130, and the rest 90% of the second type semiconductor layer 130 is then formed after the formation of the first current controlling structure 140.

Figure 12:
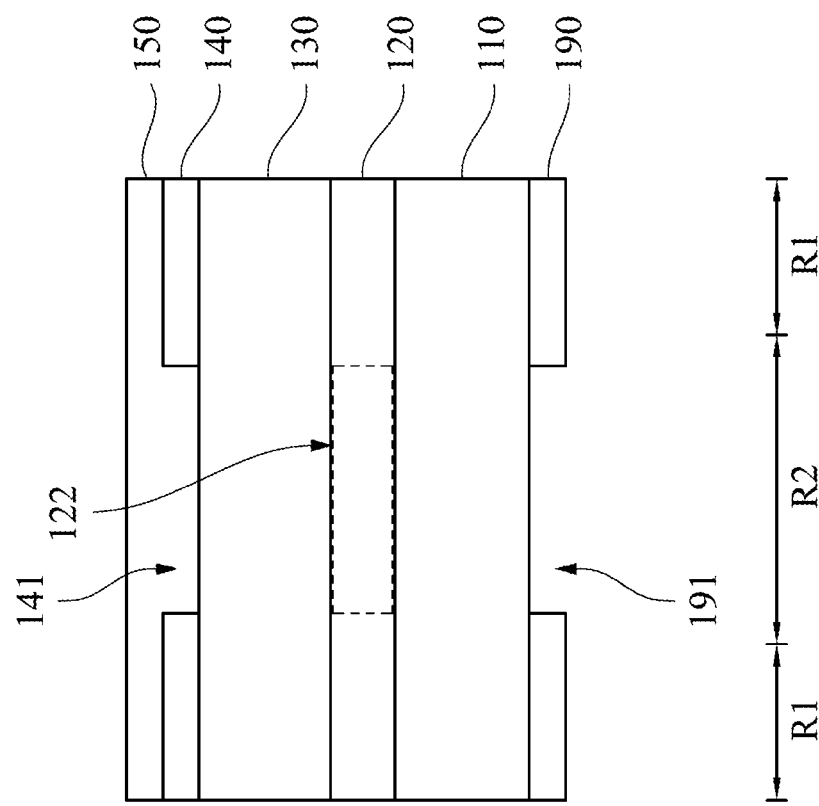
FIG. 12 is a cross-sectional view of an LED according to a seventh embodiment of the present disclosure.

FIG. 12 is a cross-sectional view of an LED 100G according to a seventh embodiment of the present disclosure. The difference between the present embodiment and the first embodiment is that the LED 100G further includes a second current controlling structure 190 having a second current-injecting zone 191.

In the present embodiment, a combination of the first type semiconductor layer 110, the active layer 120, and the second type semiconductor layer 130 is between the first current controlling structure 140 and the second current controlling structure 190. In addition, the vertical projection of first current-injecting zone 141 on the second current controlling structure 190 at least partially overlaps with the second current-injecting zone 191. More specifically, the second current-injecting zone 191 of the second current controlling structure 190 faces away from the first current-injecting zone 141 of the first current controlling structure 140. In other words, the first current-injecting zone 141 and the second current-injecting zone 191 face to opposite directions.

Similarly, the first type semiconductor layer 110 has a first region R1 with a first threading dislocation density and a second region R2 with a second threading dislocation density, in which the first threading dislocation density is greater than the second threading dislocation density. Under this configuration, the vertical projection of the active layer 120 corresponding to the second region R2 on the second current controlling structure 190 at least partially overlaps with the second current-injecting zone 191. As previously described, since a light emitting area 122 of the active layer 120 is present within the region having the lower threading dislocation density, the luminous efficiency of the LED 100D can be improved.

Furthermore, in some embodiments, the arrangement of the first current controlling structure 140 and the second current controlling structure 190 can be varied according to the above embodiments. For example, at least one of the first current controlling structure 140 and the second current controlling structure 190 can be disposed within the first type semiconductor layer 110 or the second type semiconductor layer 130. In the embodiments involving at least one of current controlling structures is disposed within the semiconductor layer, the current controlling structure disposed within the semiconductor layer may contact the active layer 120 or may be separated from the active layer 120 by at least a part of the semiconductor layer.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A light-emitting diode (LED), comprising:
a first type semiconductor layer having a first region and a second region, wherein the first region has a first threading dislocation density, the second region has a second threading dislocation density, and the first threading dislocation density is greater than the second threading dislocation density;
an active layer joined with the first type semiconductor layer;
a second type semiconductor layer joined with the active layer; and
at least one current controlling structure joined with at least one of the first type semiconductor layer and the second type semiconductor layer, the current controlling structure having at least one current-injecting zone that allows carriers to pass through, wherein a vertical projection of the second region on the current controlling structure at least partially overlaps with the current-injecting zone.

2. The LED of claim 1, wherein the current-injecting zone is separated from an edge of said one of the first type semiconductor layer and the second type semiconductor layer by at least a part of the current controlling structure.

3. The LED of claim 1, wherein the current-injecting zone is adjacent to an edge of said one of the first type semiconductor layer and the second type semiconductor layer.

4. The LED of claim 1, wherein the vertical projection of the second region on the current controlling structure is larger than the current-injecting zone, and the current-injecting zone is present within the vertical projection of the second region on the current controlling structure.

5. The LED of claim 1, wherein the vertical projection of the second region on the current controlling structure is larger than at least one of a plurality of the current-injecting zones, and said one of the current-injecting zones is present within the vertical projection of the second region on the current controlling structure.

6. The LED of claim 1, further comprising:
at least one dislocation-controlling feature joined with the first type semiconductor layer, wherein the vertical projection of the dislocation-controlling feature on the current controlling structure at least partially overlaps with the current-injecting zone.

7. The LED of claim 6 wherein the dislocation-controlling feature is reflective.

8. The LED of claim 1, further comprising:
at least one electrode electrically coupled with said one of the first type semiconductor layer and the second type semiconductor layer through the current-injecting zone of the current controlling structure.

9. The LED of claim 1, wherein the current controlling structure is disposed within said one of the first type semiconductor layer and the second type semiconductor layer.

10. The LED of claim 9, wherein the active layer is disposed between the first type semiconductor layer and the second type semiconductor layer, and the current controlling structure contacts the active layer.

11. The LED of claim 9, wherein the active layer is disposed between the first type semiconductor layer and the second type semiconductor layer, and the current controlling structure is separated from the active layer by at least a part of said one of the first type semiconductor layer and the second type semiconductor layer.

12. A method for manufacturing a light-emitting diode (LED), the method comprising:
forming at least one dislocation-controlling feature on a substrate;
forming a first type semiconductor layer on the dislocation-controlling feature and the substrate, wherein the first type semiconductor layer has a first region and a second region, and the dislocation-controlling feature causes a threading dislocation density of the first region to be greater than that of the second region;
forming a second type semiconductor layer on the first type semiconductor layer; and
forming a current controlling structure joined with at least one of the first type semiconductor layer and the second type semiconductor layer, wherein the current controlling structure has at least one current-injecting zone therein, and a vertical projection of the dislocation-controlling feature on the current controlling structure at least partially overlaps with the current-injecting zone.

13. The method of claim 12, wherein the dislocation-controlling feature is a dislocation-blocking feature.

14. The method of claim 13, wherein the dislocation-blocking feature is made of a dielectric material.

15. The method of claim 13, wherein the dislocation-blocking feature is made of a reflective material.

16. The method of claim 13, wherein the dislocation-blocking feature is strip-shaped, zig-zag shaped, circular, polygonal, or any combinations thereof.

17. The method of claim 13, further comprising:
forming a buffer layer on the substrate before formation of the dislocation-blocking feature, wherein the dislocation-blocking feature is formed on the buffer layer.

18. The method of claim 13, further comprising:
forming an epitaxial lateral overgrowth (ELOG) layer at least on the dislocation-blocking feature, wherein the first type semiconductor layer is formed at least on the ELOG layer.

19. The method of claim 12, wherein the dislocation-controlling feature is a dislocation-reduction feature.

20. The method of claim 12, further comprising:
removing at least the dislocation-controlling feature and the substrate.

\* \* \* \* \*